(12) United States Patent
Kim et al.

(10) Patent No.: US 9,748,193 B2
(45) Date of Patent: Aug. 29, 2017

(54) PRINTED CIRCUIT BOARD AND SEMICONDUCTOR PACKAGE USING THE SAME

(71) Applicant: SAMSUNG ELECTRONICS CO., LTD., Suwon-si (KR)

(72) Inventors: Young-ja Kim, Asan-si (KR); Jun-young Ko, Cheonan-si (KR)

(73) Assignee: SAMSUNG ELECTRONICS CO., LTD., Suwon (KR)

( * ) Notice: Subject to any disclaimer, the term of this patent is extended or adjusted under 35 U.S.C. 154(b) by 109 days.

(21) Appl. No.: 14/698,444

(22) Filed: Apr. 28, 2015

(65) Prior Publication Data

US 2016/0007459 A1 Jan. 7, 2016

(30) Foreign Application Priority Data

Jul. 4, 2014 (KR) ........................ 10-2014-0083902

(51) Int. Cl.
*H05K 3/34* (2006.01)
*H05K 1/11* (2006.01)
*H01L 23/00* (2006.01)
*H01L 23/498* (2006.01)

(52) U.S. Cl.
CPC ........ *H01L 24/17* (2013.01); *H01L 23/49838* (2013.01); *H01L 24/16* (2013.01);
(Continued)

(58) Field of Classification Search
CPC . H05K 2201/0989; H05K 2201/09909; H05K 2201/09881; H05K 2201/099; H05K 3/3452
See application file for complete search history.

(56) References Cited

U.S. PATENT DOCUMENTS 4,861,941 A * 8/1989 Kubo .................. H05K 3/341
174/350
5,459,287 A * 10/1995 Swamy .................. H05K 1/114
174/250
(Continued)

FOREIGN PATENT DOCUMENTS

JP 05327145 A * 12/1993
JP 09092966 A * 4/1997
(Continued)

OTHER PUBLICATIONS

"PCB PSR Process"; SMV; Where Your Dreams Come True; 17 pages total.
(Continued)

*Primary Examiner* — Nathan Milakovich
(74) *Attorney, Agent, or Firm* — Sughrue Mion, PLLC

(57) ABSTRACT

A printed circuit board (PCB) includes: a base substrate including a top surface including an electronic device mounting region; chip connection pads that are provided on the electronic device mounting region; a conductive pattern group that is provided on the top surface of the base substrate and includes an extended conductive pattern extending between two adjacent chip connection pads from among the chip connection pads, the extended conductive pattern being spaced apart from each of the two adjacent chip connection pads; and a solder resist layer that covers a part of the extended conductive pattern and is spaced apart from the chip connection pads.

33 Claims, 22 Drawing Sheets

(52) U.S. Cl.
CPC ...... *H05K 3/3452* (2013.01); *H01L 23/49816* (2013.01); *H01L 2224/131* (2013.01); *H01L 2224/13082* (2013.01); *H01L 2224/13144* (2013.01); *H01L 2224/13147* (2013.01); *H01L 2224/13155* (2013.01); *H01L 2224/16013* (2013.01); *H01L 2224/16058* (2013.01); *H01L 2224/16105* (2013.01); *H01L 2224/16113* (2013.01); *H01L 2224/16237* (2013.01); *H01L 2224/16238* (2013.01); *H01L 2224/17051* (2013.01); *H01L 2224/17104* (2013.01); *H01L 2224/73204* (2013.01); *H01L 2224/81191* (2013.01); *H01L 2224/81194* (2013.01); *H01L 2924/13091* (2013.01); *H01L 2924/15311* (2013.01); *H05K 1/111* (2013.01); *H05K 3/3436* (2013.01); *H05K 2201/0989* (2013.01); *H05K 2201/09227* (2013.01); *H05K 2201/09909* (2013.01)

(56) References Cited

U.S. PATENT DOCUMENTS

| | | | | |
|---|---|---|---|---|
| 5,511,306 A * | 4/1996 | Denton | | H05K 1/114 228/180.1 |
| 5,892,277 A * | 4/1999 | Ikemizu | | H01L 23/49572 257/700 |
| 5,936,309 A * | 8/1999 | Kim | | H01L 23/3107 174/261 |
| 6,219,912 B1 * | 4/2001 | Shimizu | | H01L 21/481 174/250 |
| 6,268,645 B1 * | 7/2001 | Takenaka | | H01L 23/3107 257/668 |
| 6,396,707 B1 * | 5/2002 | Huang | | H01L 23/49816 257/738 |
| 6,525,275 B1 | 2/2003 | Asai | | |
| 6,650,016 B1 * | 11/2003 | MacQuarrie | | H01L 21/485 228/180.22 |
| 6,750,404 B1 * | 6/2004 | Anslow | | H05K 1/113 174/261 |
| 6,777,814 B2 * | 8/2004 | Iwasaki | | H01L 24/81 257/657 |
| 6,831,234 B1 | 12/2004 | Asai et al. | | |
| 6,909,184 B2 * | 6/2005 | Ushijima | | H01L 23/13 257/668 |
| 7,173,828 B2 * | 2/2007 | Lin | | H01L 23/49816 257/E23.062 |
| 7,838,998 B2 * | 11/2010 | Ozawa | | H01L 21/563 257/678 |
| 8,021,932 B2 | 9/2011 | Ota et al. | | |
| 8,049,325 B2 | 11/2011 | Mu-Seob et al. | | |
| 8,198,546 B2 | 6/2012 | Kawamura et al. | | |
| 8,304,663 B2 | 11/2012 | Ohsumi | | |
| 8,314,344 B2 | 11/2012 | Sakaguchi et al. | | |
| 8,319,115 B2 | 11/2012 | Ohsumi | | |
| 8,322,596 B2 | 12/2012 | Hayashi et al. | | |
| 8,415,796 B2 | 4/2013 | Yamano | | |
| 8,575,495 B2 | 11/2013 | Muramatsu et al. | | |
| 8,581,403 B2 | 11/2013 | Ouchi | | |
| 8,604,359 B2 | 12/2013 | Chen et al. | | |
| 8,610,001 B2 | 12/2013 | Kato | | |
| 8,624,132 B2 | 1/2014 | Kawamura et al. | | |
| 8,633,586 B2 | 1/2014 | Kim et al. | | |
| 8,952,531 B2 * | 2/2015 | Choi | | H01L 21/76895 257/737 |
| 2002/0074650 A1 * | 6/2002 | Takahashi | | H01L 21/561 257/723 |
| 2002/0140083 A1 * | 10/2002 | Matsuda | | H01L 24/49 257/711 |
| 2002/0157861 A1 * | 10/2002 | Arrington | | H05K 3/243 174/255 |
| 2005/0269384 A1 * | 12/2005 | Liu | | B23K 3/08 228/125 |
| 2006/0033210 A1 * | 2/2006 | Chauhan | | H01L 23/49816 257/737 |
| 2006/0067062 A1 * | 3/2006 | Ishimoto | | H05K 1/0215 361/753 |
| 2006/0131067 A1 | 6/2006 | Byun et al. | | |
| 2006/0221586 A1 * | 10/2006 | Yang | | H01L 23/49548 361/782 |
| 2007/0209830 A1 * | 9/2007 | Chu | | H01L 23/13 174/261 |
| 2007/0272437 A1 * | 11/2007 | Kondo | | H01L 23/49811 174/260 |
| 2008/0042278 A1 * | 2/2008 | Liu | | H01L 23/49816 257/738 |
| 2008/0135279 A1 * | 6/2008 | Ishido | | H01L 23/49816 174/255 |
| 2008/0142993 A1 * | 6/2008 | Ozawa | | H01L 23/49816 257/778 |
| 2008/0289859 A1 * | 11/2008 | Mikado | | H05K 1/0281 174/254 |
| 2009/0101395 A1 * | 4/2009 | Horikiri | | H05K 3/341 174/255 |
| 2009/0173245 A1 * | 7/2009 | Irisawa | | B41C 1/14 101/128.21 |
| 2009/0201657 A1 * | 8/2009 | Tanaka | | H01L 23/49822 361/783 |
| 2009/0283317 A1 * | 11/2009 | Ozawa | | H01L 23/49822 174/267 |
| 2010/0139965 A1 * | 6/2010 | Wang | | H05K 3/462 174/261 |
| 2010/0164097 A1 * | 7/2010 | Pendse | | H01L 21/563 257/737 |
| 2010/0258953 A1 * | 10/2010 | Takeda | | H01L 23/49816 257/782 |
| 2010/0321544 A1 * | 12/2010 | Matsuo | | H01L 21/76898 348/294 |
| 2011/0042828 A1 * | 2/2011 | Sota | | H01L 23/13 257/774 |
| 2011/0133334 A1 * | 6/2011 | Pendse | | H01L 21/76885 257/737 |
| 2012/0181560 A1 * | 7/2012 | Hiramatsu | | H01L 33/60 257/98 |
| 2013/0001274 A1 * | 1/2013 | Konno | | H01L 23/49838 228/104 |
| 2013/0075900 A1 * | 3/2013 | Shim | | H01L 21/50 257/737 |
| 2013/0077275 A1 * | 3/2013 | Kariyazaki | | H01L 23/49838 361/783 |
| 2013/0240254 A1 * | 9/2013 | Peng | | H05K 1/111 174/257 |
| 2013/0313013 A1 * | 11/2013 | Porta | | H05K 1/0225 174/268 |
| 2014/0103098 A1 * | 4/2014 | Choi | | B23K 3/06 228/223 |
| 2015/0223335 A1 * | 8/2015 | Liao | | H05K 1/111 361/760 |
| 2016/0027754 A1 * | 1/2016 | Katagiri | | H01L 23/49816 257/737 |

FOREIGN PATENT DOCUMENTS

| | | | |
|---|---|---|---|
| JP | 2008085088 A | * | 4/2008 |
| JP | 2009170563 A | * | 7/2009 |
| JP | 2011254112 A | * | 12/2011 |
| KR | 10-2010-0059061 A | | 6/2010 |

OTHER PUBLICATIONS

"PCB Manufacturing Process Manual"; PCB Manufacture; Eunsung Eleccom Co., Ltd.; A4(297X210); 29 pages total [Retrieved from http://cfile22.uf.tistory.com/attach/166FBB174AA5A2EF829F3B] 2009.

* cited by examiner

PRINTED CIRCUIT BOARD AND SEMICONDUCTOR PACKAGE USING THE SAME

CROSS-REFERENCE TO RELATED APPLICATION

This application claims priority to Korean Patent Application No. 10-2014-0083902, filed on Jul. 4, 2014, in the Korean Intellectual Property Office, the disclosure of which is incorporated herein in its entirety by reference.

BACKGROUND

1. Field

The exemplary embodiments relate to a printed circuit board (PCB) and a semiconductor package using the PCB, and more particularly, to a PCB corresponding to a semiconductor chip having a fine-pitch connection terminal, and a semiconductor package using the PCB.

2. Description of the Related Art

With the rapid development of electronic industries and increased user demand, electronic devices are being further miniaturized and multi-functionalized. Consequently, semiconductor devices used in electronic devices are also required to be miniaturized and multi-functionalized. Thus, a semiconductor chip having a fine-pitch connection terminal is required, but an electric defect may be generated while connecting the semiconductor chip and a PCB.

SUMMARY

The exemplary embodiments provide a printed circuit board (PCB) corresponding to a semiconductor chip having a fine-pitch connection terminal, and a semiconductor package using the PCB.

According to an aspect of an exemplary embodiment, there is provided a printed circuit board (PCB) including: a base substrate including a top surface including an electronic device mounting region; chip connection pads that are provided on the electronic device mounting region; a conductive pattern group that is provided on the top surface of the base substrate and includes an extended conductive pattern extending between two adjacent chip connection pads from among the chip connection pads, the extended conductive pad being spaced apart from each of the two adjacent chip connection pads; and a solder resist layer that covers a part of the extended conductive pattern and is spaced apart from the chip connection pads.

The solder resist layer may comprise a first solder resist layer that covers a part of the electronic device mounting region on the top surface of the base substrate; and a second solder resist layer that covers at least a part of a region excluding the electronic device mounting region on the top surface of the base substrate.

The second solder resist layer may be spaced apart from the first solder resist layer.

The conductive pattern group may protrude from the top surface of the base substrate, and the first solder resist layer may cover both a part of a side surface and a part of a top surface of the protruding extended conductive pattern.

A part of the conductive pattern group may be embedded in the top surface of the base substrate, and the first solder resist layer may cover a part of the extended conductive pattern provided in a space between the two adjacent chip connection pads.

The first solder resist layer may be provided plurally and the first solder resist layers may have island shapes which are spaced apart from each other.

The second solder resist layer may be integrally formed on the top surface of the base substrate.

The first solder resist layers each may have an L-shape.

The chip connection pads may be arranged in a matrix array structure.

The chip connection pads may be arranged in a hexagonal array structure.

The first solder resist layers may form a hexagonal array structure and are provided between the chip connection pads.

The first solder resist layer may further externally extend from a space between the two adjacent chip connection pads in which the first solder resist layer is provided.

The a first solder resist layer may extend in a diagonal direction between the chip connection pads.

The first solder resist layer may extend in a zigzag form between the chip connection pads.

The first solder resist layer may extend in a square wave form between the chip connection pads.

The chip connection pads and the conductive pattern group may have top surfaces provided at a same height with respect to the base substrate.

A part of the top surface of the base substrate contacting the chip connection pads may be exposed by the solder resist layer.

According to another aspect of an exemplary embodiment, there is provided a semiconductor package including: a printed circuit board (PCB) including a base substrate including a top surface including an electronic device mounting region, chip connection pads that are provided on the electronic device mounting region, a conductive pattern group that is provided on the top surface of the base substrate and includes an extended conductive pattern extending between two adjacent chip connection pads among the chip connection pads, the extended conductive pattern being spaced apart from each of the two adjacent chip connection pads, and a solder resist layer that covers a part of the extended conductive pattern and is spaced apart from the plurality of chip connection pads; a semiconductor chip including a semiconductor substrate including an active surface, and chip connection terminals that are adhered to the active surface of the semiconductor substrate and correspond to the chip connection pads, the semiconductor chip adhering to the electronic device mounting region of the PCB such that the active surface faces the top surface of the base substrate; and a molding member formed on the PCB and surrounding part of the semiconductor chip.

The chip connection terminals each may respectively include a pillar layer and a solder layer that is provided on the pillar layer and contacts one of the chip connection pads.

The solder layer may contact a part of the solder resist layer that covers a part of the extended conductive pattern provided adjacent to the chip connection pads contacting the solder layer.

The extended conductive pattern may be disposed on both sides of a chip connection pad from among the chip connection pads, and the solder layer contacting a chip connection pad may contact a part of the solder resist layer covering a part of the extended conductive pattern disposed on both sides of the chip connection pad.

The extended conductive pattern and the solder layer may be spaced apart from each other and the solder resist layer may be provided between the extended conductive pattern and the solder layer.

The pillar layer may extend from a top surface of the solder resist layer towards the base substrate.

The molding member may cover a part of the top surface of the base substrate, which is exposed by the solder resist layer and the chip connection terminals.

The solder layer may be adjacent to one of the chip connection pads contacting the solder layer and contacts a part of the top surface of the base substrate, which is exposed by the solder resist layer.

The chip connection terminals may be each configured as a solder ball.

The molding member may cover all of the electronic device mounting region of the base substrate.

According to another aspect of an exemplary embodiment, there is provided a printed circuit board (PCB) including: a base substrate including a top surface including an electronic device mounting region; chip connection pads that are provided on the electronic device mounting region; a conductive pattern group that is provided on the top surface of the base substrate, and includes a connected conductive pattern connected to the chip connection pads, and an extended conductive pattern extending between two adjacent chip connection pads from among the chip connection pads, the extended conductive pattern being spaced apart from the two adjacent chip connection pads; and a solder resist layer that covers a part of the extended conductive pattern of the electronic device mounting region on the top surface of the base substrate, and includes a first solder resist layer spaced apart from the chip connection pads and a second solder resist layer covering a part of a region excluding the electronic device mounting region on the top surface of the base substrate.

A part of the connected conductive pattern, which contacts the chip connection pads, may be exposed by the first solder resist layer.

A part of a top surface of the first solder resist layer, which covers the extended conductive pattern, may have a height higher than a height of a top surface of the chip connection pads with respect to the base substrate.

BRIEF DESCRIPTION OF THE DRAWINGS

Exemplary embodiments will be more clearly understood from the following detailed description taken in conjunction with the accompanying drawings in which.

DETAILED DESCRIPTION OF THE EXEMPLARY EMBODIMENTS

Figure 1:
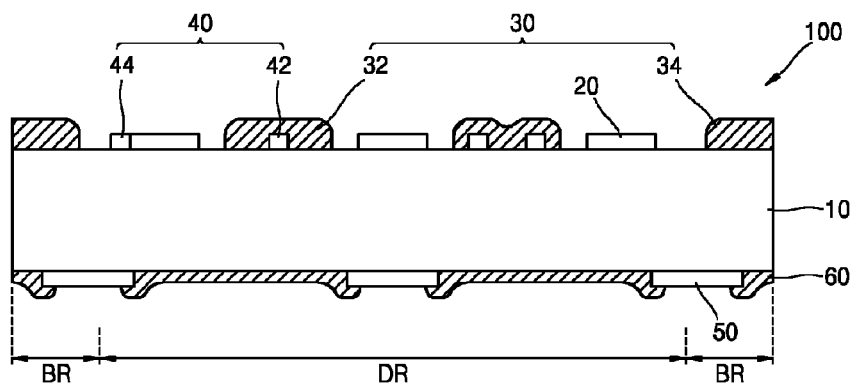
FIG. 1 is a cross-sectional view of main components of a printed circuit board (PCB) according to an exemplary embodiment.

As the exemplary embodiments allow for various changes and numerous exemplary embodiments, exemplary embodiments will be illustrated in the drawings and described in detail in the written description. However, this is not intended to limit the exemplary embodiments to particular modes of practice, and it will to be appreciated that all changes, equivalents, and substitutes that do not depart from the spirit and technical scope are encompassed in the exemplary embodiments. In the drawings, like reference numerals denote like elements, and the sizes and thicknesses of layers and regions may be exaggerated for clarity.

It will also be understood that when an element is referred to as being "on" another element, the element can be directly on the other element, or an intervening element may also be present. On the other hand, when an element is referred to as being "directly on" another element, it may be understood that an intervening element does not exist. Other expressions describing a relationship between elements, such as "between" and "directly between", may be interpreted in the same manner.

While such terms as "first", "second", etc., may be used to describe various elements, such elements must not be limited to the above terms. The above terms are used only to distinguish one element from another. For example, a first element may be referred to as a second element and similarly, a second element may be referred to as a first element without departing from the scope.

An expression used in the singular encompasses the expression of the plural, unless the expression has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

As used herein, the term "and/or" includes any and all combinations of one or more of the associated listed items. Expressions such as "at least one of," when preceding a list of elements, modify the entire list of elements and do not modify the individual elements of the list Unless defined otherwise, technical and scientific terms used herein have the same meaning as is commonly understood by one of skill in the art to which the exemplary embodiments belong.

Hereinafter, one or more exemplary embodiments will be described in detail with reference to accompanying drawings.

FIG. 1 is a cross-sectional view of main components of a printed circuit board (PCB) 100 according to an exemplary embodiment.

Referring to FIG. 1, the PCB 100 includes a base substrate 10 having an electronic device mounting region DR and a peripheral region BR on a top surface, and a plurality of chip connection pads 20.

The base substrate 10 is formed of an insulating material that may be rigid or flexible. The base substrate 10 may be formed of at least one material selected from, for example, phenol resin, epoxy resin, and polyimide (PI). For example, the base substrate 10 may include at least one material selected from, for example, bismaleimide triazine (BT) resin, frame retardant 4 (FR4), PI, polyester (PET), tetra-functional epoxy, polyphenylene ether, epoxy/polyphenylene oxide, thermount, cyanate ester, and liquid crystal polymer.

The base substrate 10 may be formed of an insulating material in a single layer. Alternatively, the base substrate 10 may be formed by combining a plurality of insulating material layers.

The plurality of chip connection pads 20 may be disposed on the electronic device mounting region DR of the top surface of the base substrate 10. The chip connection pads 20 may be disposed to correspond to chip connection pads (refer to reference numerals 220 and 220a of FIGS. 15 through 20) of a semiconductor chip to be adhered to the PCB 100. An external connection pad 50 may be disposed on a bottom surface of the base substrate 10. An external connection terminal (refer to reference numeral 70 of FIGS. 15 through 20) may be connected to the external connection pad 50.

A conductive pattern group 40 may be formed on the top surface of the base substrate 10. Although not illustrated, a bottom surface conductive pattern group that is connected to or spaced apart from the external connection pad 50 may be formed on the bottom surface of the base substrate 10.

A penetration electrode (not shown) that electrically connects the top and bottom surfaces of the base substrate 10 may be formed inside the base substrate 10. The penetration electrode may electrically connect the chip connection pad 20 and the external connection pad 50.

When the base substrate 10 is formed of the plurality of insulating material layers, an internal conductive pattern group may be formed between the two adjacent insulating material layers. When the base substrate 10 is formed of the plurality of insulating material layers, the penetration electrode may penetrate through one or more insulating material layers, and may be electrically connected to the internal conductive pattern group.

The conductive pattern group 40 may include an extended conductive pattern 42 and a connected conductive pattern 44. The extended conductive pattern 42 may extend between the two adjacent chip connection pads 20 while being spaced apart from each of the two adjacent chip connection pads 20. The connected conductive pattern 44 may be connected to the chip connection pad 20. The conductive pattern group 40 may include all conductive patterns disposed on the top surface of the base substrate 10, excluding the chip connection pad 20.

In detail, the extended conductive pattern 42 may denote a region of the conductive pattern group 40, the region being disposed between the two adjacent chip connection pads 40 and extended while being spaced apart from each of the two adjacent chip connection pads 20. The connected conductive pattern 44 may denote a region of the conductive pattern group 40, the region being connected to the chip connection pad 20 around the chip connection pad 20.

The chip connection pad 20, the conductive pattern group 40, and the external connection pad 50 may be formed of copper (Cu) or a metal material containing Cu, such as nickel (Ni), stainless steel, or beryllium (Be) Cu, or may be formed by partially plating a material, such as Ni or gold (Au), on a pattern formed of Cu or a metal material containing Cu.

The plurality of chip connection pads 20 and the conductive pattern group 40 may protrude from the top surface of the base substrate 10. The plurality of chip connection pads 20 and the conductive pattern group 40 may be formed to have a top surface at the same level (e.g., at the same height or layer) with respect to the base substrate 10. The plurality of chip connection pads 20 and the conductive pattern group 40 may be a circuit wire formed by coating and patterning a Cu foil on the top surface of the base substrate 10. Alternatively, the plurality of chip connection pads 20 may include a first layer (not shown) having a top surface on the same level as the conductive pattern group 40 with respect to the base substrate 10, and a metallic second layer (not shown) formed on the first layer. The metallic second layer may be formed to increase contact force and decrease contact resistance with the chip connection terminal (refer to reference numerals 220 and 220a of FIGS. 15 through 20) of the semiconductor chip to be adhered to the PCB 100. For example, the metallic second layer may be formed via hot air solder leveling (H.A.S.L.) or Ni/Au plating.

A solder resist layer 30 may be formed on the top surface of the base substrate 10. The solder resist layer 30 may cover a part of the extended conductive pattern 42 and may be spaced apart from the plurality of chip connection pads 20. The solder resist layer 30 may be formed by, for example, using a solder mask insulating ink of an epoxy component. The solder resist layer 30 may be formed by, for example, directly coating a thermosetting ink via a silk screen print method or an inkjet method, and then thermally hardening the thermosetting ink. The solder resist layer 30 may be formed by, for example, coating a photo-imageable solder resist via a screen method or a spray coating method, removing an unnecessary region via exposure or developing, and then thermally hardening the photo-imageable solder resist. The solder resist layer 30 may be formed by, for example, adhering a film type solder resist material on the base substrate 10 via a laminating method.

A part of the top surface of the base substrate 10 may be exposed by the solder resist layer 30. A part of the top surface of the base substrate 10, which contacts the plurality of chip connection pads 20, may be exposed by the solder resist layer 30.

The solder resist layer 30 may include a first solder resist layer 32 and a second solder resist layer 34. The first and second solder resist layers 32 and 34 may be spaced apart from each other. The first solder resist layer 32 may cover a part of the electronic device mounting region DR of the top surface of the base substrate 10. The second solder resist layer 34 may cover at least a part of the peripheral region BR that is a region of the top surface of the base substrate 10 excluding the electronic device mounting region DR. The electronic device mounting region DR may be a center region of the top surface of the base substrate 10, and the peripheral region BR may be an edge region of the top surface of the base substrate 10 surrounding the electronic device mounting region DR.

The first solder resist layer 32 may cover both a part of a protruding side surface of the extended conductive pattern 42 and a part of a top surface of the extended conductive pattern 42. The first solder resist layer 32 may cover all of side and top surfaces of the extended conductive pattern 42 in a limited space between the two adjacent chip connection pads 20, where the extended conductive pattern 42 is formed. A top surface of a region of the first solder resist layer 32 covering the extended conductive pattern 42 may have a level higher than a top surface of the chip connection pad 20 with respect to the base substrate 10.

There may be a plurality of the first solder resist layers 32 forming island shapes which are spaced apart from each other. A shape of the first solder resist layer 32 will be described in detail later with reference to FIGS. 3 through 14.

The external connection pad 50 may be formed via the same or a similar method as a method used to form the plurality of chip connection pads 20 described above. A bottom surface conductive pattern group (not shown) may be further formed on the bottom surface of the base substrate 10, as well as the external connection pad 50. The bottom surface conductive pattern group may be connected to or spaced apart from the external connection pad 50. Since a relationship between the bottom surface conductive pattern group and the external connection pad 50 is similar to a relationship between the conductive pattern group 40 and the chip connection pad 20, details thereof are not repeated here.

A bottom surface solder resist layer 60 may be formed on the bottom surface of the base substrate 10. The bottom surface solder resist layer 60 may expose a part of the external connection pad 50. The bottom surface solder resist layer 60 may expose only a center region of the external connection pad 50 by covering a region adjacent to edges of side and top surfaces of the external connection pad 50. The bottom surface conductive pattern group may not be exposed by being completely covered by the bottom surface solder resist layer 60.

The bottom surface solder resist layer 60 may expose only a part of the top surface of the external connection pad from among the external connection pads 50 formed on the bottom surface of the base substrate 10 and conductive material layers including the bottom surface conductive pattern group. The bottom surface solder resist layer 60 may cover all of the bottom surface of the base substrate 10. The bottom surface solder resist layer 60 may be formed via the same or similar method as a method used to form the solder resist layer 30.

Figure 2:
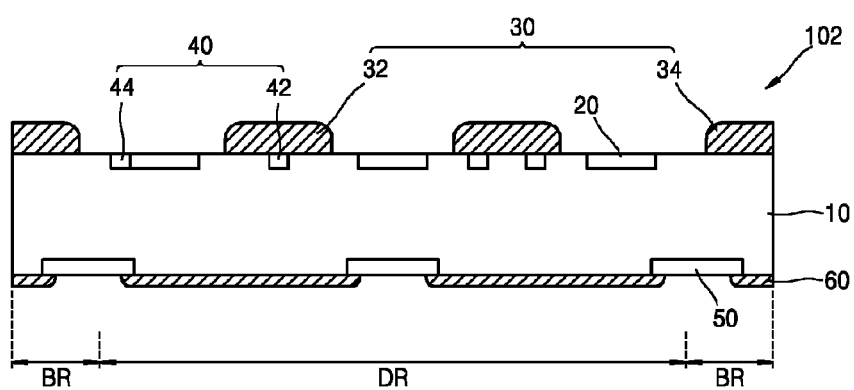
FIG. 2 is a cross-sectional view of main components of a PCB according to another exemplary embodiment.

FIG. 2 is a cross-sectional view of main components of a PCB 102 according to another exemplary embodiment. A description of details about the PCB 102 that are the same as details of the PCB 100 of FIG. 1 may not be repeated.

Referring to FIG. 2, the PCB 102 includes the base substrate 10 having the electronic device mounting region DR and the peripheral region BR on the top surface, and the plurality of chip connection pads 20. The plurality of chip connection pads 20 may be disposed in the electronic device mounting region DR of the top surface of the base substrate 10.

The conductive pattern group 40 may be formed on the top surface of the base substrate 10. The conductive pattern group 40 may include the extended conductive pattern 42 and the connected conductive pattern 44. The external connection pad 50 may be disposed on the bottom surface of the base substrate 10.

At least parts of the plurality of chip connection pads 20 and conductive pattern group 40 may be embedded in the top surface of the base substrate 10. In other words, the PCB 102 may be an embedded trace substrate. The plurality of chip connection pads 20 and the conductive pattern group 40 may be formed to have the top surfaces in the same level with respect to the base substrate 10. The plurality of chip connection pads 20 and the conductive pattern group 40 may be formed to have the top surface in the same level as the top surface of the base substrate 10.

The solder resist layer 30 may be formed on the top surface of the base substrate 10. The solder resist layer 30 may cover a part of the extended conductive pattern 42 and may be spaced apart from the plurality of chip connection pads 20.

A part of the top surface of the base substrate 10 may be exposed by the solder resist layer 30. A part of the top surface of the base substrate 10, which contacts the plurality of chip connection pads 20, may be exposed by the solder resist layer 30.

The solder resist layer 30 may include the first solder resist layer 32 and the second solder resist layer 34. The first and second solder resist layers 32 and 34 may be spaced apart from each other.

The first solder resist layer 32 may also cover a part of the extended conductive pattern 42 exposed by the base substrate 10. If only the top surface of the extended conductive pattern 42 is exposed as the extended conductive pattern 42 is embedded by the base substrate 10, the first solder resist layer 32 may also cover a part of the top surface of the extended conductive pattern 42. The first solder resist layer 32 may cover all of the top surface of the extended conductive pattern 42 in a limited space between the two adjacent chip connection pads 20 where the extended conductive pattern 42 is formed. A top surface of a region of the solder resist layer 30 covering the extended conductive pattern 42 may have a level higher than the top surface of the chip connection pad 20 with respect to the base substrate 10.

The bottom surface solder resist layer 60 may be formed on the bottom surface of the base substrate 10.

FIGS. 1 and 2 illustrate the PCBs 100 and 102 as single components, but alternatively, the PCBs 100 and 102 may be formed in an array PCB and the array PCB may be divided into single components during the manufacturing of the semiconductor package.

The array PCB is formed as a plurality of single PCBs connected to each other to form a large array.

The array PCB further includes a rail and a tab route. According to an exemplary embodiment, the rail denotes extra PCB materials added to sides of an array of single PCBs so as to easily handle the array PCB during an assembly process. The tab route denotes a small tab enabling a single PCB to be attached to another single PCB or the rail.

FIGS. 3 through 14 are plan views of PCBs 100a through 100l according to exemplary embodiments. Main components of the PCBs 100a through 100l of FIGS. 3 through 14 may be the same as main components of PCBs 100 and 102 of FIGS. 1 and 2. Accordingly, while describing FIGS. 3 through 14, a description of details which may be the same as details of FIGS. 1 and 2 may not be repeated. Also, a description of details which may be the same between FIGS. 3 through 14 may not be repeated.

Figure 3:
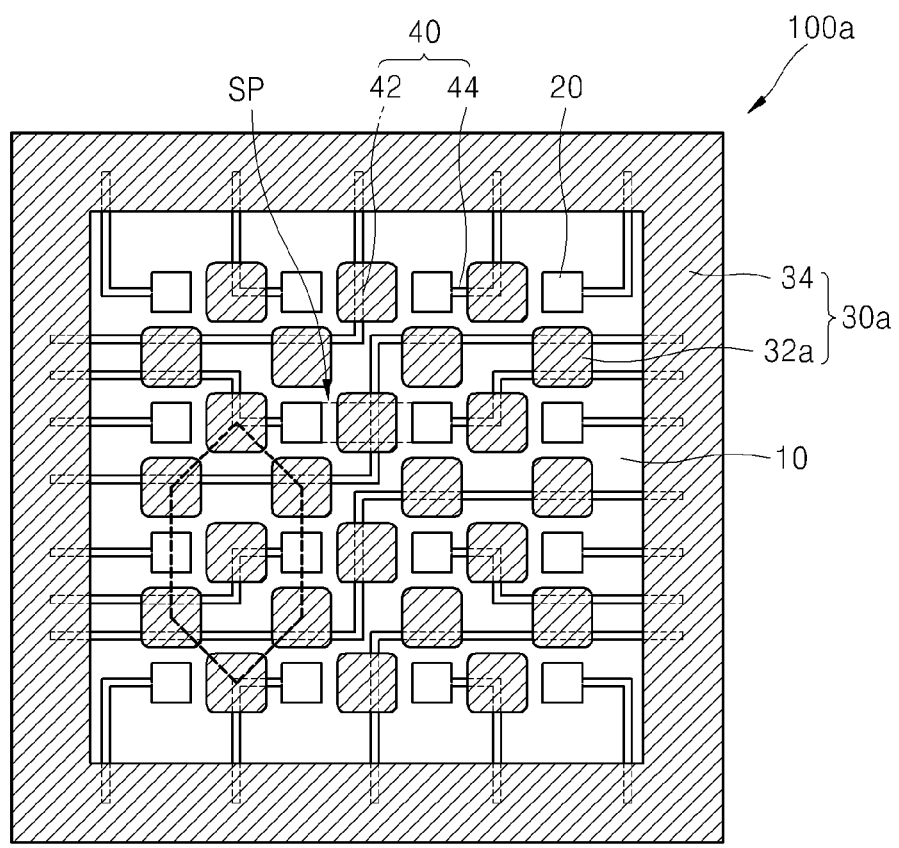
FIG. 3 is a plan view of a PCB according to an exemplary embodiment.

FIG. 3 is a plan view of the PCB 100a according to an exemplary embodiment.

Referring to FIG. 3, the PCB 100a may include the base substrate 10, and the plurality of chip connection pads 20, a solder resist layer 30a, and the conductive pattern group 40, which are disposed on the top surface of the base substrate 10.

The conductive pattern group 40 may include the extended conductive pattern 42 and the connected conductive pattern 44. The extended conductive pattern 42 may extend while being spaced apart from each of the two adjacent chip connection pads 20 along a limited space SP between the two adjacent chip connection pads 20. The connected conductive pattern 44 may be connected to the chip connection pad 20.

The solder resist layer 30a may include a first solder resist layer 32a and the second solder resist layer 34. The first and second solder resist layers 32a and 34 may be spaced apart from each other. There may be a plurality of the first solder resist layers 32a having island shapes which are spaced apart from each other. The second solder resist layer 34 may be spaced apart from each of the plurality of first solder resist layers 32a having island shapes.

The plurality of chip connection pads 20 may be arranged in a matrix array structure. The plurality of first solder resist layers 32a may have a hexagonal array structure, and may be disposed between the plurality of chip connection pads 20.

A region of the extended conductive pattern 42 disposed in the limited space SP between the two adjacent chip connection pads 20 may be covered by the first solder resist layer 32a. The limited space SP between the two adjacent chip connection pads 20 is a space between the two adjacent chip connection pads 20 facing each other, and assuming that one rectangular space is formed by connecting the two adjacent chip connection pads 20 facing each other, the limited space SP is a space obtained by excluding the two adjacent chip connection pads 20 from the rectangular space. If the extended conductive pattern 42 protrudes from the top surface of the base substrate 10 as shown in FIG. 1, the top and side surfaces of the region of the extended conductive pattern 42 disposed in the limited space SP between the two adjacent chip connection pads 20 may be covered by the first solder resist layer 32a. If the extended conductive pattern 42 is embedded in the base substrate 10 as shown in FIG. 2, the top surface of the region of the extended conductive pattern 42 disposed in the limited space SP between the two adjacent chip connection pads 20 may be covered by the first solder resist layer 32a.

The first solder resist layer 32a may further extend externally from the limited space SP between the two adjacent chip connection pads 20 where the first solder resist layer 32a is disposed, for example, in a direction perpendicular to a direction the two adjacent chip connection pads 20 are disposed. The first solder resist layer 32a may further extend from the limited space SP between the two adjacent chip connection pads 20 in a direction different from the direction the two adjacent chip connection pads 20 are disposed. At this time, a part of the extended conductive pattern 42 further extending externally from the limited space SP between the two adjacent chip connection pads 20 may also be covered by the first solder resist layer 32a.

A part of the top surface of the base substrate 10 contacting the plurality of chip connection pads 20 may be exposed by the solder resist layer 30a by the first solder resist layer 32a. Also, a part of the connected conductive pattern 44 contacting the chip connection pad 20 may be exposed by the first solder resist layer 32a. The second solder resist layer 34 may be integrally formed on the top surface of the base substrate 10. The second solder resist layer 34 may be integrally formed such that parts contacting an edge of the top surface of the base substrate 10 are covered.

As will be described later, a molding member 300 of FIGS. 15 through 20 included in a semiconductor package formed by using the PCB 100a may be formed to cover a part of the top surface of the base substrate 10 where the second solder resist layer 34 is not formed such that the conductive pattern group 40 disposed on the top surface of the base substrate 10 and the top surface of the base substrate 10 are covered by the second solder resist layer 34 and the molding member 300 and not exposed.

The first and second solder resist layers 32a and 34 may be simultaneously formed or separately formed. For example the first solder resist layer 32a may be formed after the second solder resist layer 34 is formed. Here, the second solder resist layer 34 may be formed via a method having relatively low precision and the first solder resist layer 32a may be formed via a method having relatively high precision, so that overall forming time and expenses of the solder resist layer 30a are decreased while the first solder resist layer 32a has a fine-pitch.

Figure 15:
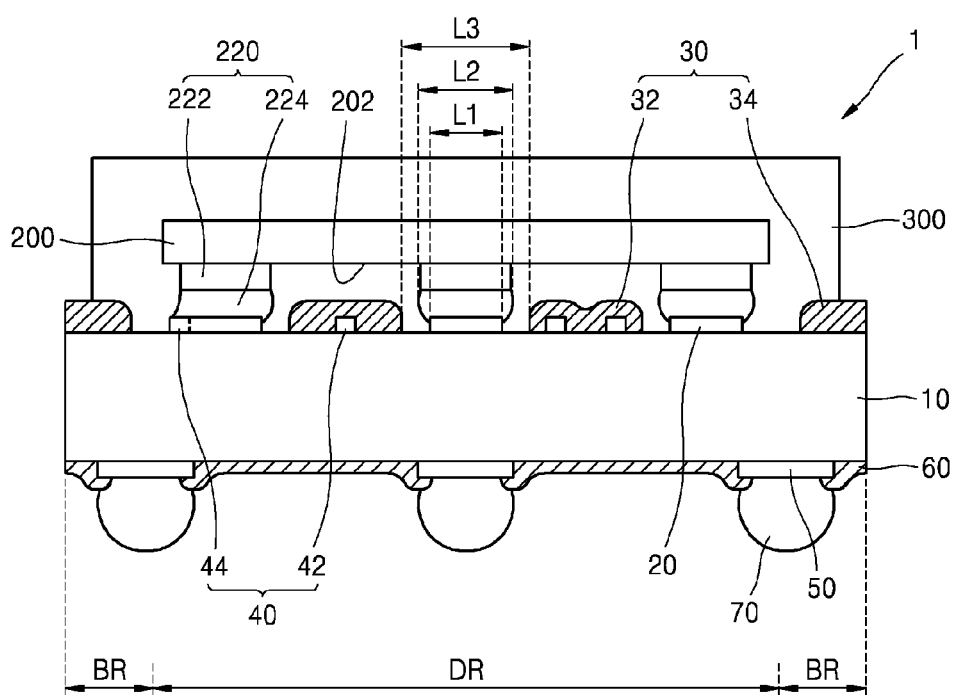
FIG. 15 is a cross-sectional view of main components of a semiconductor package according to an exemplary embodiment.
Figure 16:
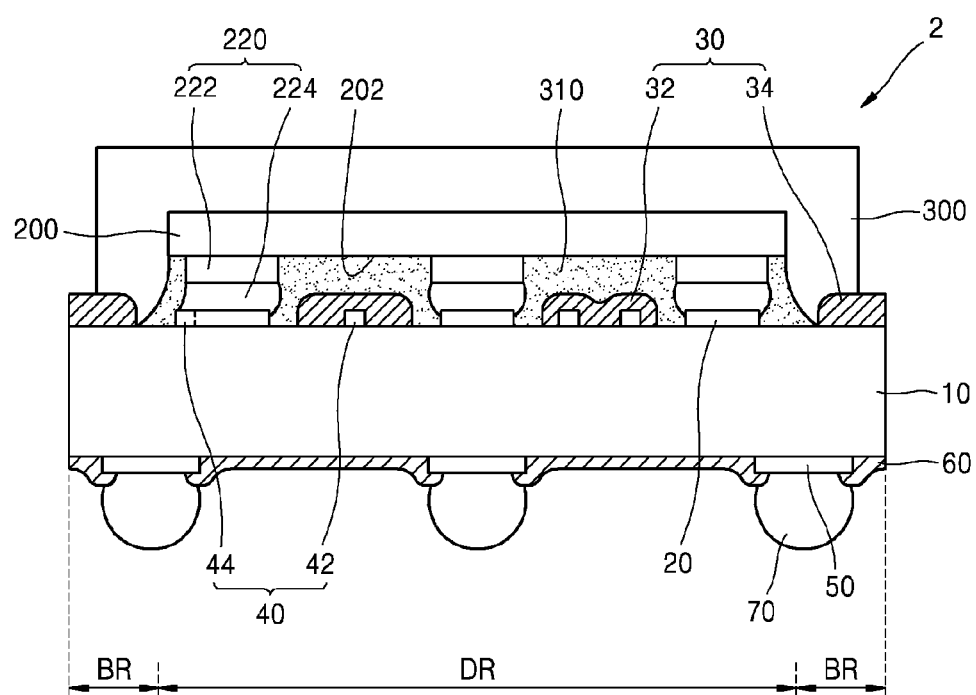
FIG. 16 is a cross-sectional view of main components of a semiconductor package according to another exemplary embodiment.

Also, since an under-fill layer 310 of FIG. 16 that fills a space between the PCB 100a and a semiconductor chip 200 of FIGS. 15 through 20 or an under-fill material, such as a molded under-fill (MUF) (refer to the molding member 300 of FIGS. 15 and 17 through 20), may be supplied along a space on the top surface of the base substrate 10 where the first solder resist layer 32a is not formed, a void is prevented from being generated inside any one of semiconductor packages 1 through 6 of FIGS. 15 through 20, and thus reliability of the semiconductor packages 1 through 6 of FIGS. 15 through 20 may be increased.

Figure 4:
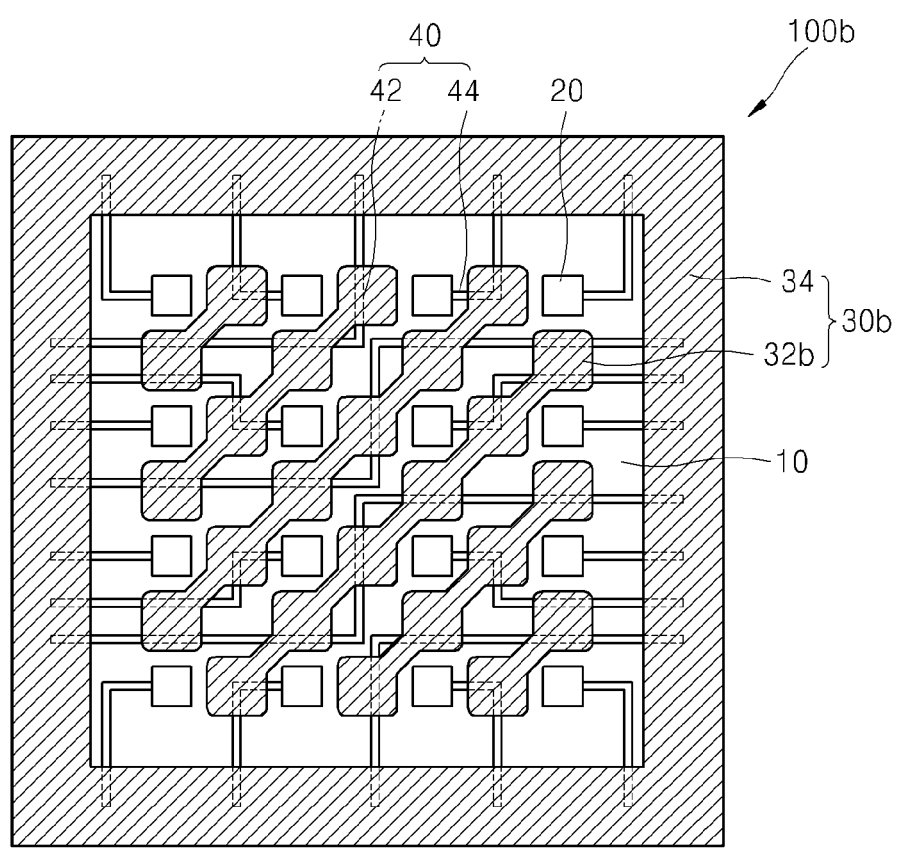
FIG. 4 is a plan view of a PCB according to another exemplary embodiment.

FIG. 4 is a plan view of the PCB 100b according to another exemplary embodiment.

Referring to FIG. 4, the PCB 100b may include the base substrate 10, and the plurality of chip connection pads 20, a solder resist layer 30b, and the conductive pattern group 40, which are disposed on the top surface of the base substrate 10. The conductive pattern group 40 may include the extended conductive pattern 42 and the connected conductive pattern 44.

The solder resist layer 30b may include a first solder resist layer 32b and the second solder resist layer 34. The first solder resist layer 32b may be disposed to extend in a diagonal direction between the plurality of chip connection pads 20. There may be a plurality of the first solder resist layers 32b that have island shapes which are spaced apart from each other and extend in the diagonal direction between each of the plurality of chip connection pads 20.

The plurality of chip connection pads 20 may have a matrix array structure. The first solder resist layer 32b may have a relatively wide width at a region disposed between the plurality of chip connection pads 20 (a region where each of the plurality of first solder resist layers 32a are disposed in FIG. 3), and have a relatively narrow width at a region in the diagonal direction, but the first solder resist layer 32b is not limited thereto. A width of the first solder resist layer 32b is not limited as long as the first solder resist layer 32b covers a region of the extended conductive pattern 42 disposed in a limited space between the two adjacent chip connection pads 20 while extending in the diagonal direction between the plurality of chip connection pads 20.

Since the under-fill layer 310 of FIG. 16 that fills a space between the PCB 100b and the semiconductor chip 200 of FIGS. 15 through 20 or an under-fill material, such as the MUF (refer to the molding member 300 of FIGS. 15 and 17 through 20), may be supplied along a space on the top surface of the base substrate 10 where the first solder resist layer 32b extending in the diagonal direction is not formed, a void is prevented from being generated inside any one of the semiconductor packages 1 through 6 of FIGS. 15 through 20, and thus reliability of the semiconductor packages 1 through 6 of FIGS. 15 through 20 may be increased.

Figure 5:
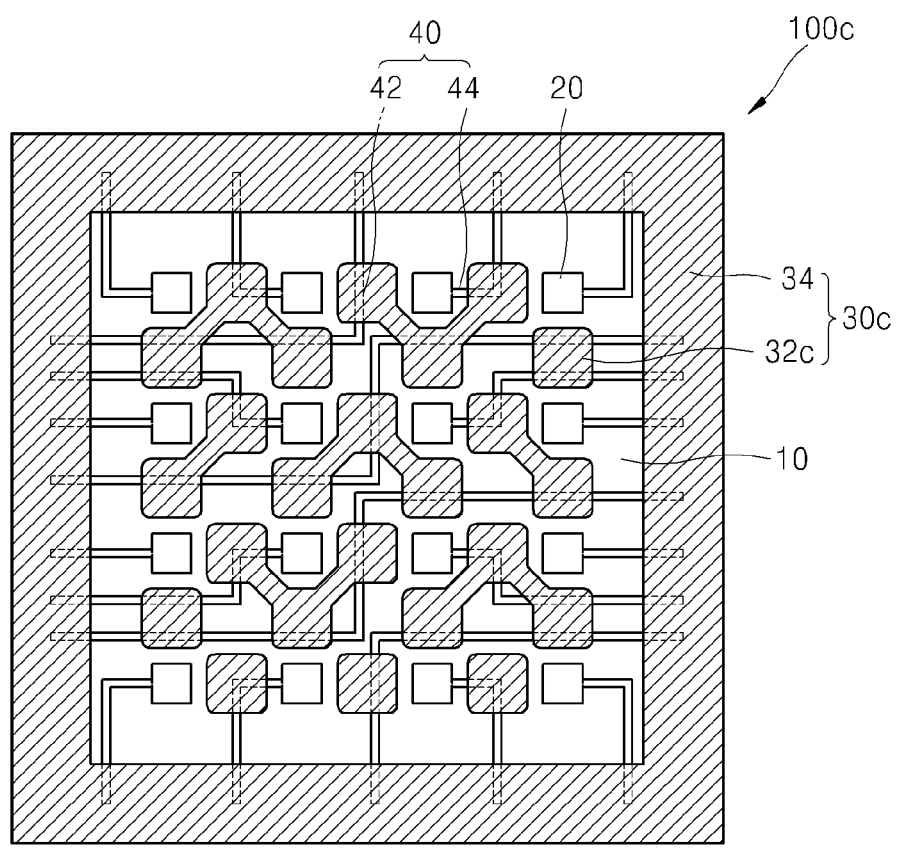
FIG. 5 is a plan view of a PCB according to another exemplary embodiment.

FIG. 5 is a plan view of the PCB 100c according to another exemplary embodiment.

Referring to FIG. 5, the PCB 100c may include the base substrate 10, and the plurality of chip connection pads 20, a solder resist layer 30c, and the conductive pattern group 40, which are disposed on the top surface of the base substrate 10. The conductive pattern group 40 may include the extended conductive pattern 42 and the connected conductive pattern 44.

The solder resist layer 30c may include a first solder resist layer 32c and the second solder resist layer 34. There may be a plurality of the first solder resist layers 32c having island shapes which are spaced apart from each other. The plurality of first solder resist layers 32c may each have an L-shape. However, some of the plurality of first solder resist layers 32c, which are disposed outside, e.g., adjacent to the second solder resist layer 34, may not have an L-shape but a part of an L-shape.

Since the under-fill layer 310 of FIG. 16 that fills a space between the PCB 100c and the semiconductor chip 200 of FIGS. 15 through 20 or an under-fill material, such as the MUF (refer to the molding member 300 of FIGS. 15 and 17 through 20), may be supplied along a space on the top surface of the base substrate 10 where the plurality of first solder resist layers 32c having an L-shape are not formed, a void is prevented from being generated inside any one of the semiconductor packages 1 through 6 of FIGS. 15 through 20, and thus reliability of the semiconductor packages 1 through 6 of FIGS. 15 through 20 may be increased.

Figure 6:
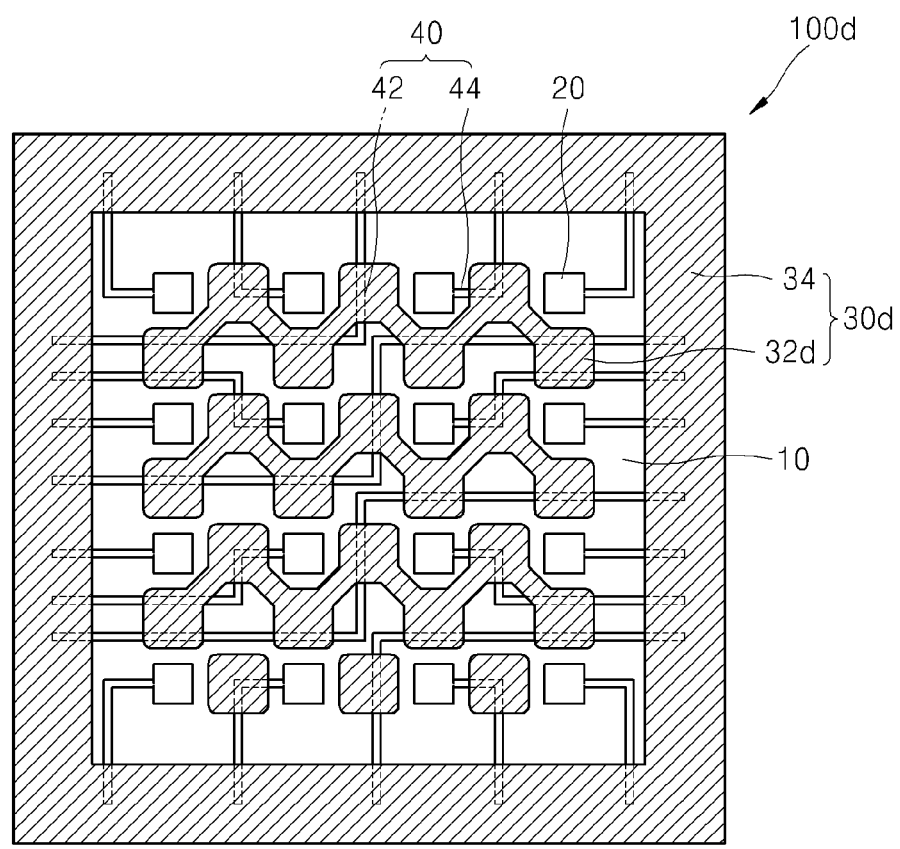
FIG. 6 is a plan view of a PCB according to another exemplary embodiment.

FIG. 6 is a plan view of the PCB 100d according to another exemplary embodiment.

Referring to FIG. 6, the PCB 100d may include the base substrate 10, and the plurality of chip connection pads 20, a solder resist layer 30d, and the conductive pattern group 40, which are disposed on the top surface of the base substrate 10. The conductive pattern group 40 may include the extended conductive pattern 42 and the connected conductive pattern 44.

The solder resist layer 30d may include a first solder resist layer 32d and the second solder resist layer 34. The first solder resist layer 32d may extend while forming a zigzag form between the plurality of chip connection pads 20. There may be a plurality of the first solder resist layers 32d having island shapes which are spaced apart from each other, and extending to form a zigzag form between each of the plurality of chip connection pads 20.

However, some of the plurality of first solder resist layers 32d, which are disposed outside, e.g., adjacent to the second solder resist layer 34, may not form a zigzag form but a part of a zigzag form.

Since the under-fill layer 310 of FIG. 16 that fills a space between the PCB 100d and the semiconductor chip 200 of FIGS. 15 through 20 or an under-fill material, such as the MUF (refer to the molding member 300 of FIGS. 15 and 17 through 20), may be supplied along a space on the top surface of the base substrate 10 where the plurality of first solder resist layers 32d extending to form a zigzag form are not formed, a void is prevented from being generated inside any one of the semiconductor packages 1 through 6 of FIGS. 15 through 20, and thus reliability of the semiconductor packages 1 through 6 of FIGS. 15 through 20 may be increased.

Figure 7:
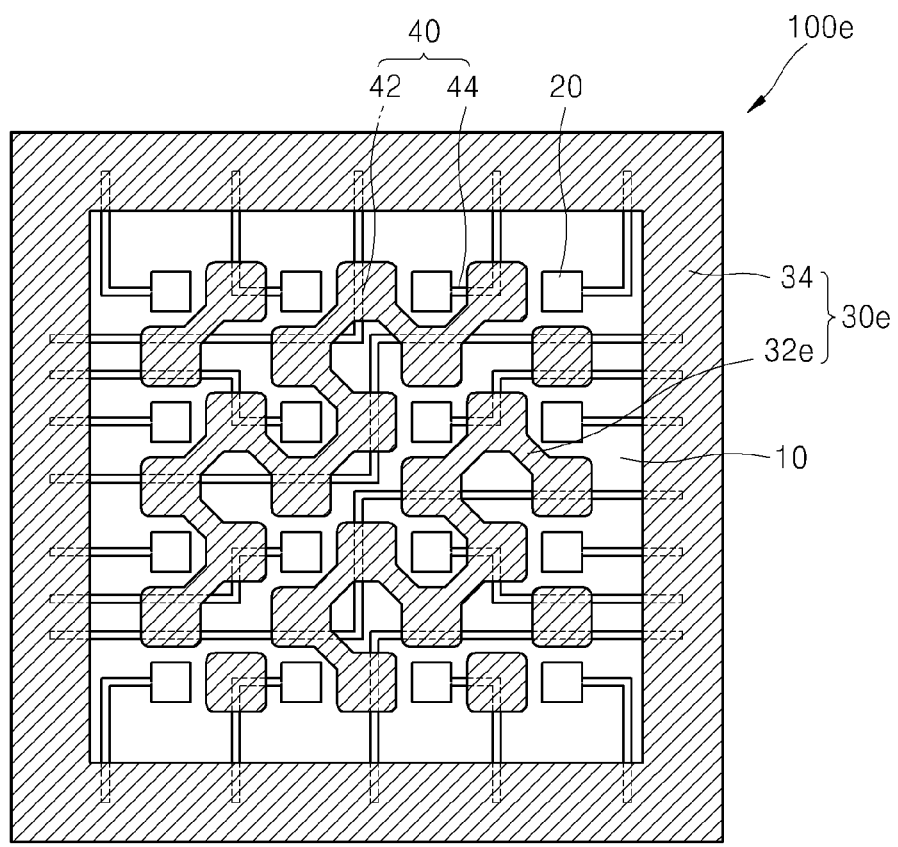
FIG. 7 is a plan view of a PCB according to another exemplary embodiment.

FIG. 7 is a plan view of the PCB 100e according to another exemplary embodiment.

Referring to FIG. 7, the PCB 100e may include the base substrate 10, and the plurality of chip connection pads 20, a solder resist layer 30e, and the conductive pattern group 40, which are disposed on the top surface of the base substrate 10. The conductive pattern group 40 may include the extended conductive pattern 42 and the connected conductive pattern 44.

The solder resist layer 30e may include a first solder resist layer 32e and the second solder resist layer 34. The first solder resist layer 32e may extend while forming a square wave form between the plurality of chip connection pads 20. There may be a plurality of the first solder resist layers 32e having island shapes which are spaced apart from each other and extending while forming a square wave form between each of the plurality of chip connection pads 20.

However, some of the plurality of first solder resist layers 32e, which are disposed outside, e.g., adjacent to the second solder resist layer 34, may not form a square wave form but a part of a square wave form.

Since the under-fill layer 310 of FIG. 16 that fills a space between the PCB 100e and the semiconductor chip 200 of FIGS. 15 through 20 or an under-fill material, such as the MUF (refer to the molding member 300 of FIGS. 15 and 17 through 20), may be supplied along a space on the top surface of the base substrate 10 where the plurality of first solder resist layers 32e extending to form a square wave form are not formed, a void is prevented from being generated inside any one of the semiconductor packages 1 through 6 of FIGS. 15 through 20, and thus reliability of the semiconductor packages 1 through 6 of FIGS. 15 through 20 may be increased.

Figure 8:
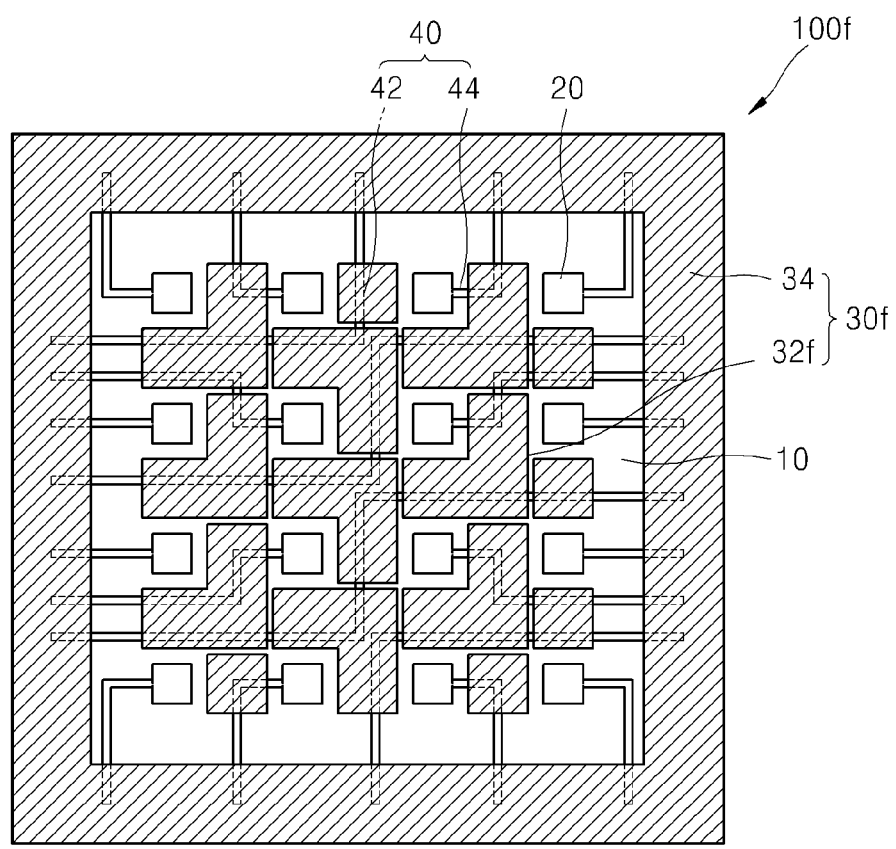
FIG. 8 is a plan view of a PCB according to another exemplary embodiment.

FIG. 8 is a plan view of the PCB 100f according to another exemplary embodiment.

Referring to FIG. 8, the PCB 100f may include the base substrate 10, and the plurality of chip connection pads 20, a solder resist layer 30f, and the conductive pattern group 40, which are disposed on the top surface of the base substrate 10. The conductive pattern group 40 may include the extended conductive pattern 42 and the connected conductive pattern 44.

The solder resist layer 30f may include a first solder resist layer 32f and the second solder resist layer 34. There may be a plurality of the first solder resist layers 32f having island shapes which are spaced apart from each other. The plurality of first solder resist layers 32f may each have an L-shape. However, some of the plurality of first solder resist layers 32f, which are disposed outside, e.g., adjacent to the second solder resist layer 34, may not form an L-shape but a part of an L-shape.

The first solder resist layer 32c of FIG. 5 and the first solder resist layer 32f of FIG. 8 both have L-shapes, but directions of the L-shapes are different. Also, the first solder resist layer 32f of FIG. 8 may cover a relatively greater part of the conductive pattern group 40 than a part of the conductive pattern covered by the first solder resist layer 32c, and the first solder resist layer 32c of FIG. 5 may cover a relatively greater part of the top surface of the base substrate 10 than a part of the top surface of the base substrate 10 covered by the first solder resist layer 32f. Accordingly, one of the PCB 100c of FIG. 5 and the PCB 100f of FIG. 8 may be selected considering which one of factors, e.g., smooth supplying of an under-fill material and protecting of the conductive pattern group 40, affects reliability of the semiconductor packages 1 through 6 of FIGS. 15 through 20 to a greater degree. Other factors may also be considered instead of or in addition to the factors noted above.

Figure 9:
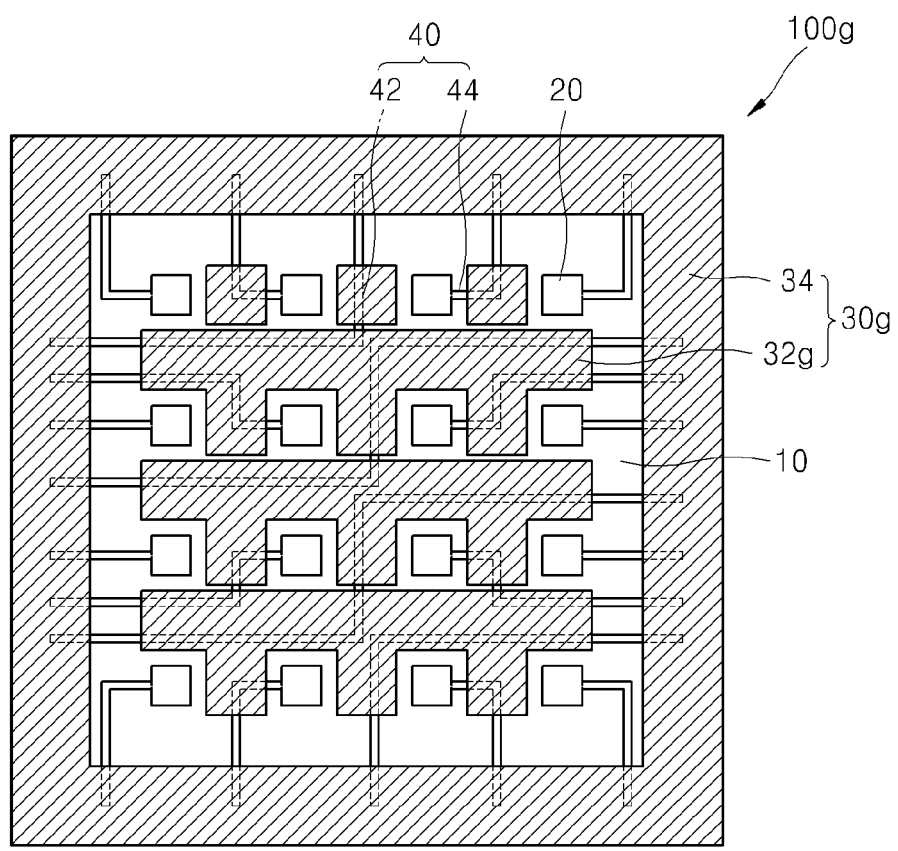
FIG. 9 is a plan view of a PCB according to another exemplary embodiment.

FIG. 9 is a plan view of the PCB 100g according to another exemplary embodiment.

Referring to FIG. 9, the PCB 100g may include the base substrate 10, and the plurality of chip connection pads 20, a solder resist layer 30g, and the conductive pattern group 40, which are disposed on the top surface of the base substrate 10. The conductive pattern group 40 may include the extended conductive pattern 42 and the connected conductive pattern 44.

The solder resist layer 30g may include a first solder resist layer 32g and the second solder resist layer 34. The first solder resist layer 32g may have a region extending in one direction between the plurality of chip connection pads 20, and a branched region extending in a direction different from the one direction. For example, the first solder resist layer 32g may have a comb-shape. There may be a plurality of the first solder resist layers 32g having island shapes which are spaced apart from each other and having a comb-shape between each of the plurality of chip connection pads 20.

A branched region extending in another direction may be further formed at the first solder resist layer 32b extending in the diagonal direction as shown in FIG. 4, such that the first solder resist layer 32b has a comb-shape. Accordingly, an arrangement direction of a comb-shape of the first solder resist layer 32g may be determined considering which one of factors, e.g., smooth supplying of an under-fill material and protecting of the conductive pattern group 40, affects reliability of the semiconductor packages 1 through 6 of FIGS. 15 through 20 to a greater degree. Other factors may also be considered.

Figure 10:
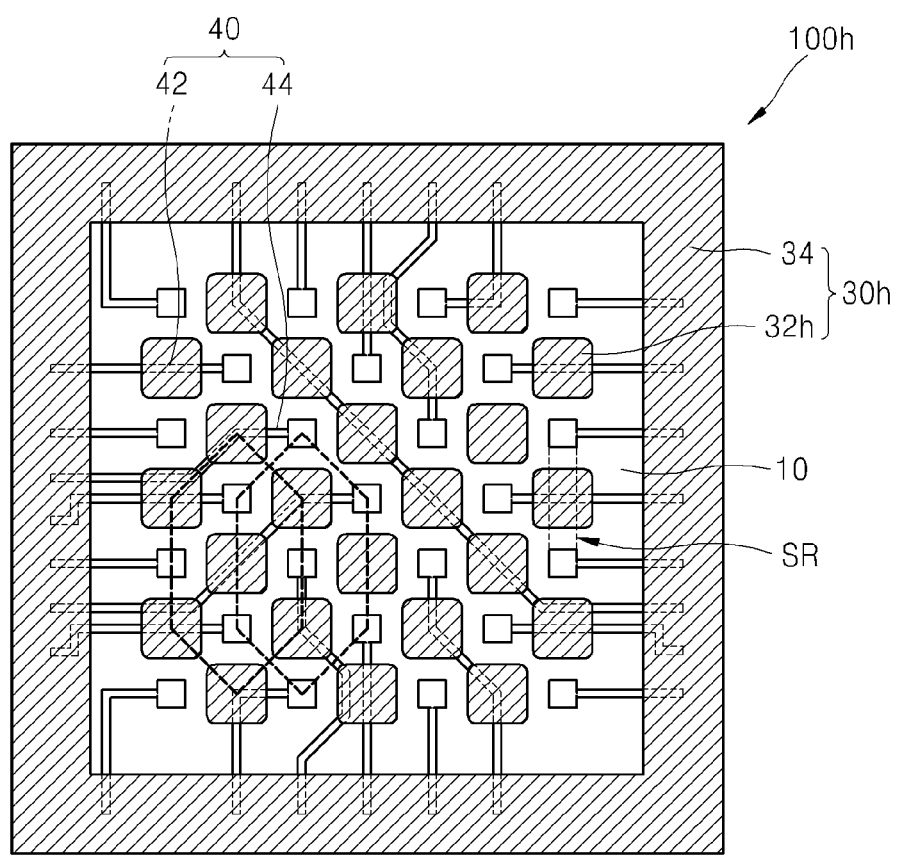
FIG. 10 is a plan view of a PCB according to another exemplary embodiment.

FIG. 10 is a plan view of the PCB 100h according to another exemplary embodiment.

Referring to FIG. 10, the PCB 100h may include the base substrate 10, and the plurality of chip connection pads 20, a solder resist layer 30h, and the conductive pattern group 40, which are disposed on the top surface of the base substrate 10.

The conductive pattern group 40 may include the extended conductive pattern 42 and the connected conductive pattern 44.

The solder resist layer 30h may include a first solder resist layer 32h and the second solder resist layer 34. The first and second solder resist layers 32h and 34 may be spaced apart from each other. There may be a plurality of the first solder resist layers 32h having island shapes which are spaced apart from each other. The second solder resist layer 34 may be spaced apart from each of the plurality of first solder resist layers 32h having island shapes.

The plurality of chip connection pads 20 may have a hexagonal array structure. The plurality of first solder resist layers 32h may have a hexagonal array structure and disposed between the plurality of chip connection pads 20.

The part of the extended conductive pattern 42 disposed in the limited space SP between the two adjacent chip connection pads 20 may be covered by the first solder resist layer 32h. The first solder resist layer 32h may further extend externally from the limited space SP between the two adjacent chip connection pads 20 where the first solder resist layer 32h is disposed. The first solder resist layer 32h may further extend in a direction different from a direction in which the two adjacent chip connection pads 20 are disposed, from the limited space SP between the two adjacent chip connection pads 20. A part of the extended conductive pattern 42, which further extends externally from the limited space SP between the two adjacent chip connection pads 20, may be covered by the first solder resist layer 32h.

Since the under-fill layer 310 of FIG. 16 that fills a space between the PCB 100h and the semiconductor chip 200 of FIGS. 15 through 20 or an under-fill material, such as the MUF (refer to the molding member 300 of FIGS. 15 and 17 through 20), may be supplied along a space on the top surface of the base substrate 10 where the first solder resist layer 32h is not formed, a void is prevented from being generated inside any one of the semiconductor packages 1 through 6 of FIGS. 15 through 20, and thus reliability of the semiconductor packages 1 through 6 of FIGS. 15 through 20 may be increased.

Figure 11:
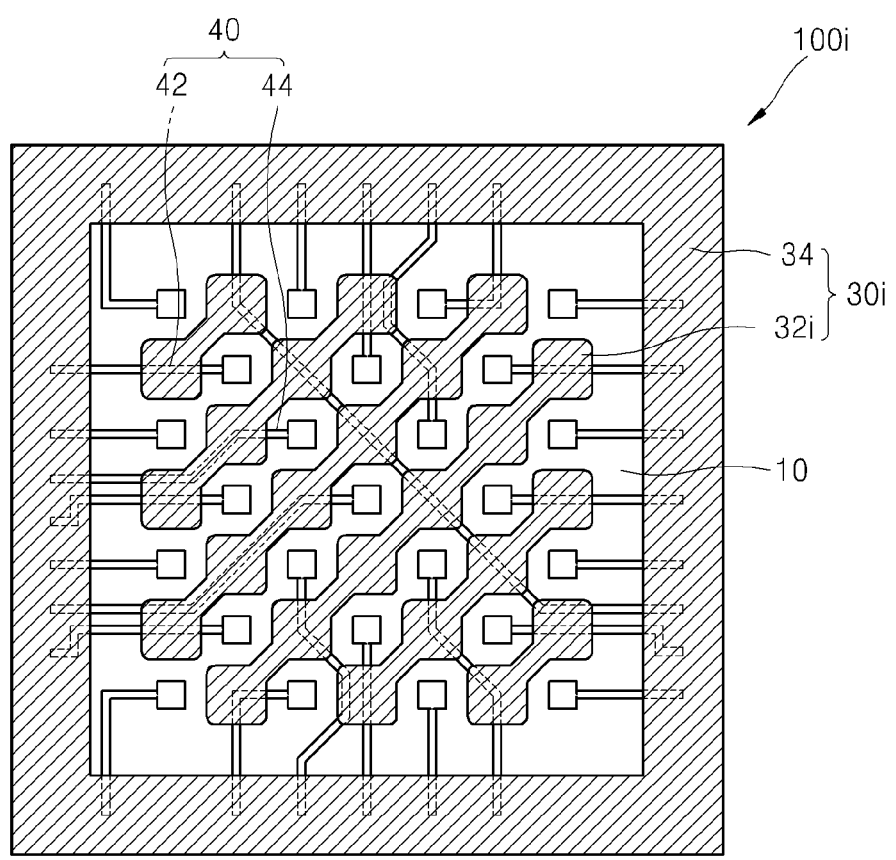
FIG. 11 is a plan view of a PCB according to another exemplary embodiment.

FIG. 11 is a plan view of the PCB 100i according to another exemplary embodiment.

Referring to FIG. 11, the PCB 100i may include the base substrate 10, and the plurality of chip connection pads 20, a solder resist layer 30i, and the conductive pattern group 40, which are disposed on the top surface of the base substrate 10. The plurality of chip connection pads 20 may have a hexagonal array structure. The conductive pattern group 40 may include the extended conductive pattern 42 and the connected conductive pattern 44.

The solder resist layer 30i may include a first solder resist layer 32i and the second solder resist layer 34. The first solder resist layer 32i may extend in a diagonal direction between the plurality of chip connection pads 20. There may be a plurality of the first solder resist layers 32i having island shapes which are spaced apart from each other, and extending in the diagonal direction between each of the plurality of chip connection pads 20.

Since the under-fill layer 310 of FIG. 16 that fills a space between the PCB 100i and the semiconductor chip 200 of FIGS. 15 through 20 or an under-fill material, such as the MUF (refer to the molding member 300 of FIGS. 15 and 17 through 20), may be supplied along a space on the top surface of the base substrate 10 where the first solder resist layer 32i extending in the diagonal direction is not formed, a void is prevented from being generated inside any one of the semiconductor packages 1 through 6 of FIGS. 15 through 20, and thus reliability of the semiconductor packages 1 through 6 of FIGS. 15 through 20 may be increased.

Figure 12:
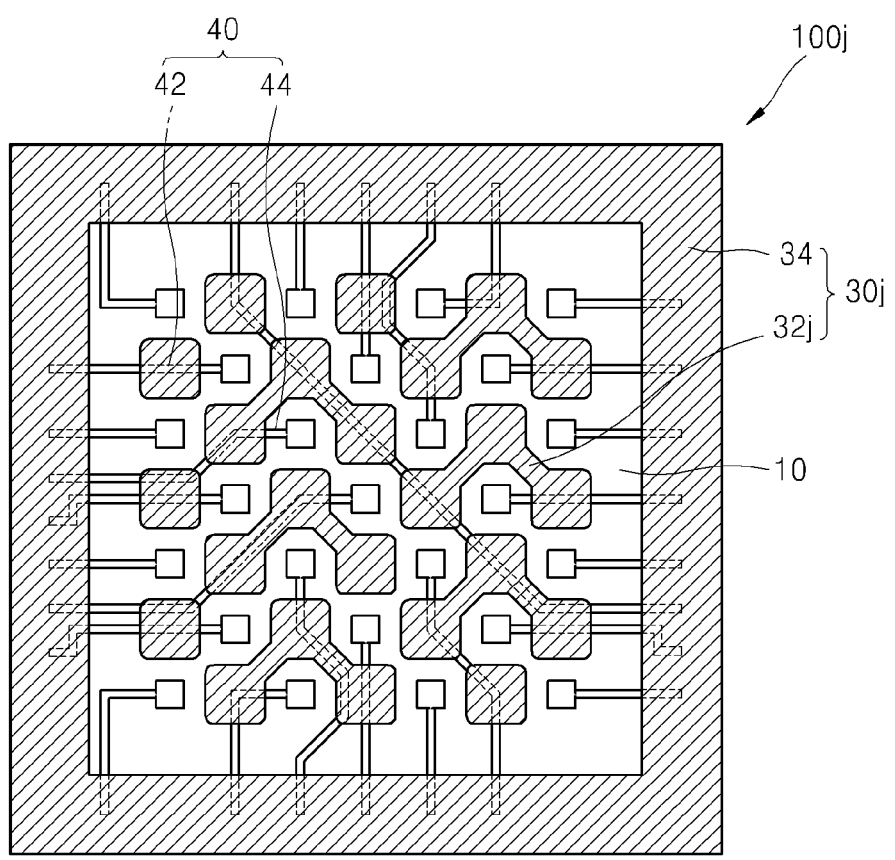
FIG. 12 is a plan view of a PCB according to another exemplary embodiment.

FIG. 12 is a plan view of the PCB 100j according to another exemplary embodiment.

Referring to FIG. 12, the PCB 100j may include the base substrate 10, and the plurality of chip connection pads 20, a solder resist layer 30*j*, and the conductive pattern group 40, which are disposed on the top surface of the base substrate 10. The plurality of chip connection pads 20 may have a hexagonal array structure. The conductive pattern group 40 may include the extended conductive pattern 42 and the connected conductive pattern 44.

The solder resist layer 30*j* may include a first solder resist layer 32*j* and the second solder resist layer 34. There may be a plurality of first solder resist layers 32*j* having island shapes which are spaced apart from each other. The plurality of first solder resist layers 32*j* may each have an L-shape. However, some of the plurality of first solder resist layers 32*j*, which are disposed outside, e.g., adjacent to the second solder resist layer 34, may not have an L-shape but a part of an L-shape.

Since the under-fill layer 310 of FIG. 16 that fills a space between the PCB 100*j* and the semiconductor chip 200 of FIGS. 15 through 20 or an under-fill material, such as the MUF (refer to the molding member 300 of FIGS. 15 and 17 through 20), may be supplied along a space on the top surface of the base substrate 10 where the plurality of first solder resist layers 32*j* having an L-shape are not formed, a void is prevented from being generated inside any one of the semiconductor packages 1 through 6 of FIGS. 15 through 20, and thus reliability of the semiconductor packages 1 through 6 of FIGS. 15 through 20 may be increased.

Figure 13:
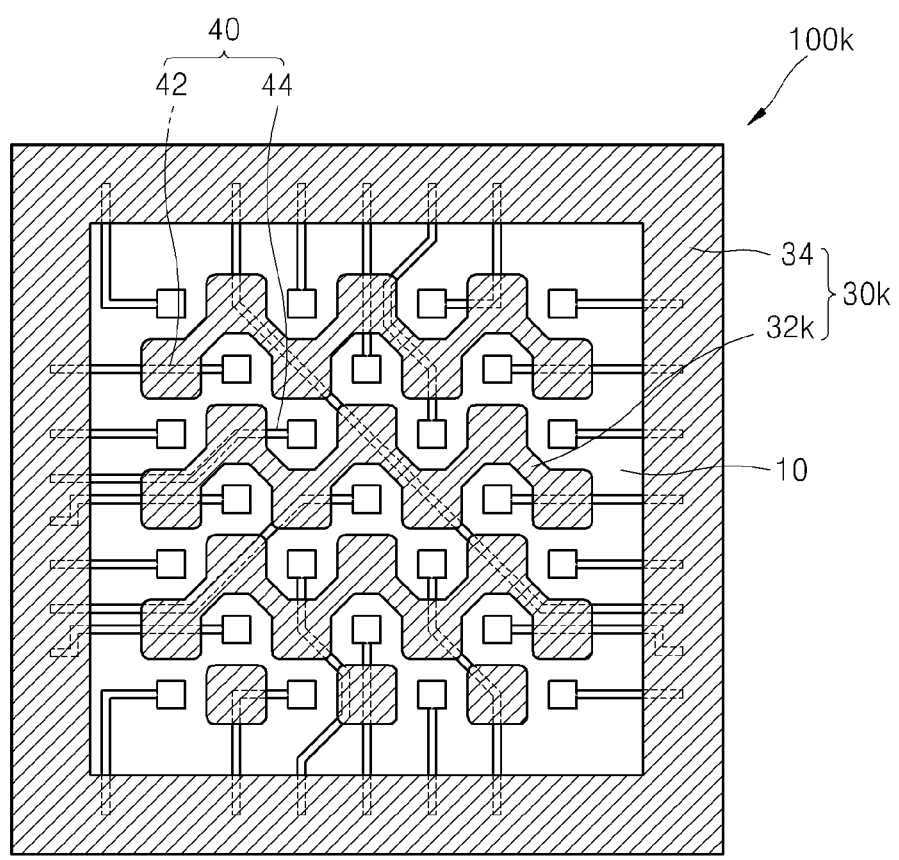
FIG. 13 is a plan view of a PCB according to another exemplary embodiment.

FIG. 13 is a plan view of the PCB 100*k* according to another exemplary embodiment.

Referring to FIG. 13, the PCB 100*k* may include the base substrate 10, and the plurality of chip connection pads 20, a solder resist layer 30*k*, and the conductive pattern group 40, which are disposed on the top surface of the base substrate 10. The plurality of chip connection pads 20 may have a hexagonal array structure. The conductive pattern group 40 may include the extended conductive pattern 42 and the connected conductive pattern 44.

The solder resist layer 30*k* may include a first solder resist layer 32*k* and the second solder resist layer 34. The first solder resist layer 32*k* may extend while forming a zigzag form between the plurality of chip connection pads 20. There may be a plurality of the first solder resist layers 32*k* having island shapes which are spaced apart from each other, and extending to form a zigzag shape between each of the plurality of chip connection pads 20.

However, some of the plurality of first solder resist layers 3*kd*, which are disposed outside, e.g., adjacent to the second solder resist layer 34, may not form a zigzag form but a part of a zigzag form.

Since the under-fill layer 310 of FIG. 16 that fills a space between the PCB 100*k* and the semiconductor chip 200 of FIGS. 15 through 20 or an under-fill material, such as the MUF (refer to the molding member 300 of FIGS. 15 and 17 through 20), may be supplied along a space on the top surface of the base substrate 10 where the first solder resist layer 32*k* extending to form a zigzag form is not formed, a void is prevented from being generated inside any one of the semiconductor packages 1 through 6 of FIGS. 15 through 20, and thus reliability of the semiconductor packages 1 through 6 of FIGS. 15 through 20 may be increased.

Figure 14:
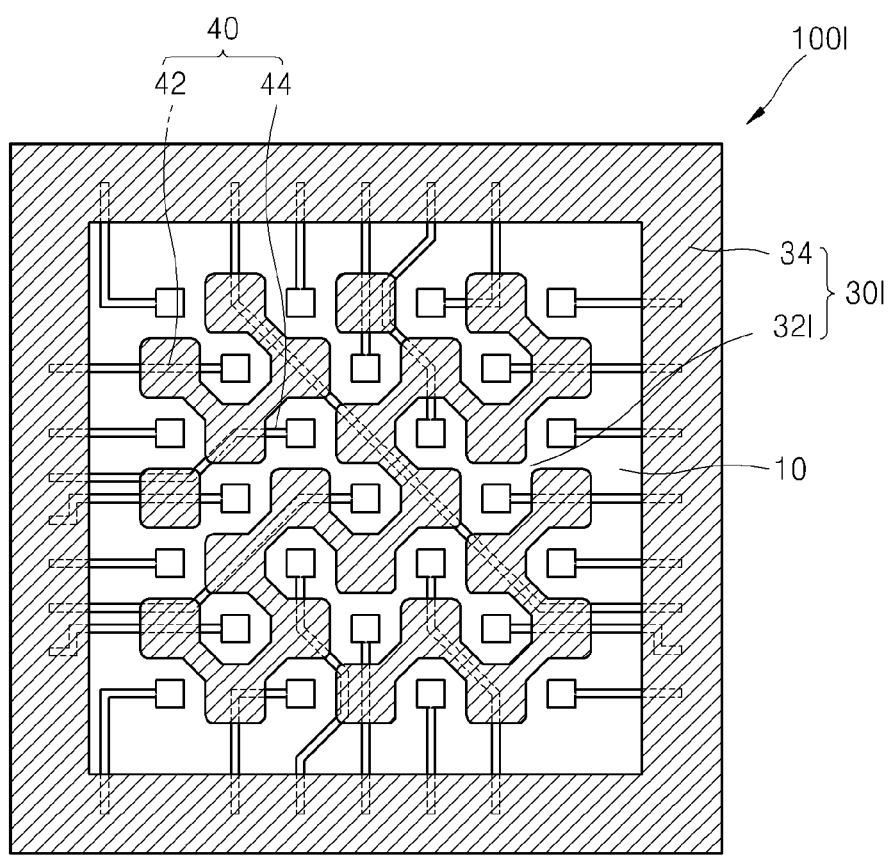
FIG. 14 is a plan view of a PCB according to another exemplary embodiment.

FIG. 14 is a plan view of the PCB 100*l* according to another exemplary embodiment.

Referring to FIG. 14, the PCB 100*l* may include the base substrate 10, and the plurality of chip connection pads 20, a solder resist layer 30*l*, and the conductive pattern group 40, which are disposed on the top surface of the base substrate 10. The plurality of chip connection pads 20 may have a hexagonal array structure. The conductive pattern group 40 may include the extended conductive pattern 42 and the connected conductive pattern 44.

The solder resist layer 30*l* may include a first solder resist layer 32*l* and the second solder resist layer 34. The first solder resist layer 32*l* may extend while forming a square wave form between the plurality of chip connection pads 20. There may be a plurality of the first solder resist layers 32*l* having island shapes which are spaced apart from each other, and extending in a square wave form between each of the plurality of chip connection pads 20.

However, some of the plurality of first solder resist layers 32*l*, which are disposed outside, e.g., adjacent to the second solder resist layer 34, may not form a square wave form but a part of a square wave form.

Since the under-fill layer 310 of FIG. 16 that fills a space between the PCB 100*l* and the semiconductor chip 200 of FIGS. 15 through 20 or an under-fill material, such as the MUF (refer to the molding member 300 of FIGS. 15 and 17 through 20), may be supplied along a space on the top surface of the base substrate 10 where the plurality of first solder resist layers 32*l* extending to form a square wave form are not formed, a void is prevented from being generated inside any one of the semiconductor packages 1 through 6 of FIGS. 15 through 20, and thus reliability of the semiconductor packages 1 through 6 of FIGS. 15 through 20 may be increased.

FIGS. 15 through 20 are cross-sectional views of main components of the semiconductor packages 1 through 6 according to exemplary embodiments. The PCB 100 included in the semiconductor packages 1 through 6 of FIGS. 15 through 20 may be replaced by the PCB 102 of FIG. 2. Also, the PCB 100 included in the semiconductor packages 1 through 6 of FIGS. 15 through 20 may have a plan view corresponding to any one of the PCBs 100*a* through 100*l* of FIGS. 3 through 14. Accordingly, while describing FIGS. 15 through 20, details which are the same as details describing FIGS. 1 and 14 may not be repeated. Also, details which are the same between the descriptions of FIGS. 15 through 20 may not be repeated.

FIG. 15 is a cross-sectional view of main components of the semiconductor package 1 according to an exemplary embodiment.

Referring to FIG. 15, the semiconductor package 1 includes the PCB 100 and the semiconductor chip 20 attached on the PCB 100.

The PCB 100 includes the base substrate 10 that has the electronic device mounting region DR and the peripheral region BR on the top surface, and the plurality of chip connection pads 20. The plurality of chip connection pads 20 may be disposed in the electronic device mounting region DR of the top surface of the base substrate 10. The external connection pad 50 may be disposed on the bottom surface of the base substrate 10.

The conductive pattern group 40 may be formed on the top surface of the base substrate 10. The conductive pattern group 40 may include the extended conductive pattern 42 and the connected conductive pattern 44. The extended conductive pattern 42 may extend between the two adjacent chip connection pads 20 while being spaced apart from each of the two adjacent chip connection pads 20. The connected conductive pattern 44 may be connected to the chip connection pad 20.

The extended conductive pattern 42 may denote a region of the conductive pattern group 40, which is disposed between the two adjacent chip connection pads 20 and extends while being spaced apart from the two adjacent chip connection pads 20. The connected conductive pattern 44 may denote a region of the conductive pattern group 40, which is connected to the chip connection pad 20 around the chip connection pad 20.

The plurality of chip connection pads 20 and the conductive pattern group 40 may protrude from the top surface of the base substrate 10. The plurality of chip connection pads 20 and the conductive pattern group 40 may have the top surfaces in the same level with respect to the base substrate 10. According to an exemplary embodiment, the semiconductor package 1 may include, instead of the PCB 100, an embedded trace substrate, such as the PCB 102 of FIG. 2, wherein at least parts of the plurality of chip connection pads 20 and conductive pattern group 40 are embedded in the top surface of the base substrate 10.

The solder resist layer 30 may be formed on the top surface of the base substrate 10. The solder resist layer 30 may cover a part of the extended conductive pattern 42, and may be spaced apart from the plurality of chip connection pads 20. A part of the top surface of the base substrate 10 may be exposed by the solder resist layer 30. A part of the top surface of the base substrate 10, which contacts the plurality of chip connection pads 20, may be exposed by the solder resist layer 30.

The solder resist layer 30 may include the first solder resist layer 32 and the second solder resist layer 34. The first and second solder resist layers 32 and 34 may be spaced apart from each other. The first solder resist layer 32 may cover a part of the electronic device mounting region DR of the top surface of the base substrate 10. The second solder resist layer 34 may cover at least a part of the peripheral region BR that is a region obtained by excluding the electronic device mounting region DR from the top surface of the base substrate 10.

The first solder resist layer 32 may cover both a part of a protruding side surface and a part of a top surface of the extended conductive pattern 42. The first solder resist layer 32 may cover both the side and top surfaces of the extended conductive pattern 42 in the limited space between the two adjacent chip connection pads 20 where the extended conductive pattern 42 is formed. A top surface of a region of the first solder resist layer 32 covering the extended conductive pattern 42 may have a level higher than the top surface of the chip connection pad 20 with respect to the base substrate 10. The first solder resist layer 32 may have the same shape as any one of the first solder resist layers 32a through 23l of FIGS. 3 through 14.

The bottom surface solder resist layer 60 may be formed on the bottom surface of the base substrate 10. The bottom surface solder resist layer 60 may expose a part of the external connection pad 50.

The semiconductor chip 200 includes a semiconductor device formed on a semiconductor substrate. The semiconductor substrate may include, for example, silicon (Si). Alternatively, the semiconductor substrate may include a semiconductor element, such as germanium (Ge), or a compound semiconductor, such as silicon carbide (SiC), gallium arsenide (GaAs), indium arsenide (InAs), or indium phosphide (InP). Alternatively, the semiconductor substrate may have a silicon-on-insulator (SOI) structure. For example, the semiconductor substrate may include a buried oxide (BOX) layer. The semiconductor substrate may include a conductive region, for example, an impurity-doped well or an impurity-doped structure. Also, the semiconductor substrate may have any one of various device isolation structures, such as a shallow trench isolation (STI) structure.

The semiconductor device may include a plurality of individual devices of various types. Examples of the individual devices may include various microelectronic devices, for example, a metal-oxide-semiconductor field effect transistor (MOSFET) such as a complementary metal-insulator-semiconductor (CMOS) transistor, a system large scale integration (LSI), an image sensor such as a CMOS imaging sensor (CIS), a micro-electro-mechanical system (MEMS), an active device, and a passive device. The plurality of individual devices may be electrically connected to the conductive region of the semiconductor substrate. The semiconductor device may further include a conductive wire or a conductive plug that electrically connects at least two of the individual devices or the plurality of individual devices and the conductive region of the semiconductor substrate. Also, the plurality of individual devices may be electrically isolated from other neighboring individual devices by insulating films.

The semiconductor device may include wire structures for connecting the plurality of individual devices to a pad formed on an active surface 202. The wire structure may include a metal wire layer and a via plug. The metal wire layer and the via plug may be formed of a wire barrier film and a wire metal layer. The wire barrier film may include at least one material selected from titanium (Ti), titanium nitride (TiN), tantalum (Ta), and aTaN. The wire metal layer may include at least one metal selected from tungsten (W), aluminum (Al), and copper (Cu). The metal wire layer and the via plug may be formed of the same material. Alternatively, at least parts of the metal wire layer and via plug may be formed to include different materials. A plurality of the metal wire layer and/or the via plug may form a multi-layer structure. In other words, the wire structure may be a multi-layer structure wherein at least two of the metal wire layers or at least two of the via plugs are alternately stacked on each other. A passivation layer for protecting the semiconductor device from an external shock or moisture may be formed on the semiconductor device, and the pad may be exposed on the active surface 202 by the passivation layer.

The number of semiconductor chips 200 may be one as shown in FIG. 15, or alternatively, a plurality of the semiconductor chips 200 may be stacked on each other by using, for example, a penetration electrode. The penetration electrode may have a pillar shape that penetrates the semiconductor substrate forming the plurality of semiconductor chips excluding the uppermost semiconductor chip.

The penetration electrode may be a through silicon via (TSV). The penetration electrode may include a wire metal layer and a barrier metal layer surrounding the wire metal layer. The wire metal layer may include Cu or W. For example, the wire metal layer may be formed of Cu, copper tin (CuSn), copper magnesium (CuMG), CuNi, copper zinc (CuZn), copper palladium (CuPd), CuAu, copper rhenium (CuRe), CuW, W, or a W alloy, but is not limited thereto. For example, the wire metal layer may include one or more of Al, Au, Be, bismuth (Bi), cobalt (Co), Cu, hafnium (Hf), In, manganese (Mn), molybdenum (Mo), Ni, lead (Pb), Pd, platinum (Pt), rhodium (Rh), ruthenium (Ru), tantalum (Ta), tellurium (Te), Ti, W, Zn, and zirconium (Zr), and one or more stacked structures. The barrier metal layer may include at least one material selected from W, tungsten nitride (WN), tungsten carbide (WC), Ti, TiN, Ta, TaN, Ru, Co, Mn, Ni, and nickel boron (NiB), and may be in a single layer or a multilayer. However, the material of the penetration electrode is not limited thereto. The barrier metal layer and the wire metal layer may be formed via a physical vapor deposition (PVD) method or a chemical vapor deposition (CVD) method, but are not limited thereto. A spacer insulating layer may be disposed between the penetration electrode and the semiconductor substrate forming the semiconductor chips where the penetration electrode is formed. The spacer insulating layer may prevent the penetration electrode from directly contacting the semiconductor device included in the semiconductor substrate where the penetration electrode is formed. The spacer insulating layer may be an oxide film, a nitride film, a carbide film, a polymer, or a combination thereof. According to one or more exemplary embodiments, a CVD method may be used to form the spacer insulating layer. The spacer insulating layer may be an ozone/tetra-ethyl ortho-silicate ($O_3$/TEOS)-based high aspect ratio process (HARP) oxide film formed via a sub-atmospheric CVD method.

A connection bump electrically connecting the penetration electrodes formed in different semiconductor chips may be formed between the plurality of semiconductor chips stacked on each other by the penetration electrodes.

The penetration electrode may have any one of a via-first structure, a via-middle structure, and a via-last structure. The via-first, via-middle, or via-last structure and a method of manufacturing the same are disclosed in various documents, such as Tree Dimensional System Integration published in 2011 by Springer, 3D Integration for VLSI Systems published in 2012 by CRC Press, and Designing TSVs for 3D Integrated Circuits published in 2013 by Springer, and thus details thereof are not repeated herein.

The active surface 202 of the semiconductor chip 200 where the semiconductor device is formed may be attached on the PCB 100 to face the PCB 100, e.g., the top surface of the base substrate 10.

The plurality of chip connection terminals 220 attached to the active surface 202 may be formed on the semiconductor chip 200. The plurality of chip connection terminals 220 may be disposed to correspond to the plurality of chip connection pads 20.

The plurality of chip connection terminals 220 may each include a pillar layer 222 and a solder layer 224 formed on the pillar layer 222 and contacting the chip connection pad 20. The pillar layer 222 may be formed of a metal material, such as Cu, Ni, Au, Sn, or an alloy thereof. The solder layer 224 may be formed of a metal material that may reflow upon receiving energy, such as heat or ultrasonic waves.

A second width L2 that is a width of the chip connection terminal 220 may have a higher value than a first width L1 that is a width of the chip connection pad 20. A width of the solder layer 224 may increase according to a reflow while forming the semiconductor package 1. Accordingly, the second width L2 may be a width of the pillar layer 222 that is not reflowed. If the second width L2 has a smaller value than the first width L1, contact resistance between the chip connection terminal 220 and the chip connection pad 20 may increase, and thus the second width L2 may be set to have a higher value than the first width L1.

The second width L2 may have a smaller value than a third width L3 that is a width of a space exposed by the first solder resist layer 32 covering the extended conductive pattern 42 adjacent to two sides of the chip connection pad 20. If the third width L3 is smaller than the second width L2, the chip connection pad 20 and the chip connection terminal 220 may not be properly connected and may short-circuit, and thus the second width L2 may be set to have a smaller value than the third width L3. If the second width L2 has a smaller value than the third width L3, the chip connection terminal 220 is easily disposed between the first solder resist layers 32, and thus the semiconductor chips 200 and the PCB 100 may be easily aligned.

Accordingly, if the first solder resist layer 32 is not formed, and the solder layer 224 reflows or the chip connection terminal 220 and the chip connection pad 20 are misaligned, the solder layer 224 may be electrically connected to the extended conductive pattern 42 adjacent to the chip connection pad 20, thereby generating a short.

However, the first solder resist layer 32 may cover the extended conductive pattern 42 in the limited space between the two adjacent chip connection pads 20 where the extended conductive pattern 42 is formed. Since the solder layer 224 contacts and is connected to the chip connection pad 20 adjacent to the extended conductive pattern 42, the solder layer 224 and the extended conductive pattern 42 may be spaced apart from each other and the first solder resist layer 32 may be disposed between the solder layer 224 and the extended conductive pattern 42. Accordingly, the semiconductor package 1 may block a short generated as the solder layer 224 is electrically connected to the extended conductive pattern 42 adjacent to the chip connection pad 20.

For example, the first width L1 may be from 25 µm to 35 µm, the second width L2 may be from 40 µm to 50 µm, and the third width L3 may be from 60 µm to 80 µm, but the widths L1, L2 and L3 are not limited thereto.

The semiconductor package 1 may further include the molding member 300 formed on the PCB 100 and surrounding at least a part of the semiconductor chip 200. The molding member 300 may be formed of, for example, an epoxy mold compound (EMC).

The molding member 300 may be formed to cover all of the electronic device mounting region DR of the base substrate 10. In other words, the molding member 300 may be an MUF for covering a part of the top surface of the base substrate 10 and a part of the conductive pattern group 40, which are exposed by the solder resist layer 30 and the plurality of chip connection terminals 220.

Since the molding member 300 may be supplied and formed between the PCB 100 and the semiconductor chip 200 along a space on the top surface of the base substrate 10 where the first solder resist layer 32 is not formed, a void is prevented from being generated in the semiconductor package 1, and thus reliability of the semiconductor package 1 may be increased.

FIG. 16 is a cross-sectional view of main components of the semiconductor package 2 according to another exemplary embodiment.

Referring to FIG. 16, the semiconductor package 2 includes the PCB 100 and the semiconductor chip 200 attached on the PCB 100.

The PCB 100 includes the base substrate 10 that has the electronic device mounting region DR and the peripheral region BR on the top surface, and the plurality of chip connection pads 20. The plurality of chip connection pads 20 may be disposed in the electronic device mounting region DR of the top surface of the base substrate 10. The external connection pad 50 may be disposed on the bottom surface of the base substrate 10.

The conductive pattern group 40 may be formed on the top surface of the base substrate 10. The conductive pattern group 40 may include the extended conductive pattern 42 and the connected conductive pattern 44. The extended conductive pattern 42 may extend between the two adjacent chip connection pads 20 while being spaced apart from each of the two adjacent chip connection pads 20. The connected conductive pattern 44 may be connected to the chip connection pad 20.

The extended conductive pattern 42 may denote a region of the conductive pattern group 40, which is disposed between the two adjacent chip connection pads 20 and extends while being spaced apart from the two adjacent chip connection pads 20. The connected conductive pattern 44 may denote a region of the conductive pattern group 40, which is connected to the chip connection pad 20 around the chip connection pad 20.

The solder resist layer 30 may be formed on the top surface of the base substrate 10. The solder resist layer 30 may cover a part of the extended conductive pattern 42, and may be spaced apart from the plurality of chip connection pads 20. A part of the top surface of the base substrate 10 may be exposed by the solder resist layer 30. A part of the top surface of the base substrate 10, which contacts the plurality of chip connection pads 20, may be exposed by the solder resist layer 30.

The solder resist layer 30 may include the first solder resist layer 32 and the second solder resist layer 34. The first and second solder resist layers 32 and 34 may be spaced apart from each other. The first solder resist layer 32 may cover a part of the electronic device mounting region DR of the top surface of the base substrate 10. The second solder resist layer 34 may cover at least a part of the peripheral region BR that is a region obtained by excluding the electronic device mounting region DR from the top surface of the base substrate 10.

The bottom surface solder resist layer 60 may be formed on the bottom surface of the base substrate 10. The bottom surface solder resist layer 60 may expose a part of the external connection pad 50.

The semiconductor chip 200 includes a semiconductor device formed on the semiconductor substrate. The semiconductor chip 200 may be attached on the PCB 100 such that the active surface 202 where the semiconductor device is formed faces the PCB 100, e.g., the top surface of the base substrate 10.

The plurality of chip connection terminals 220 attached to the active surface 202 may be formed on the semiconductor chip 200. The plurality of chip connection terminals 220 may be disposed to correspond to the plurality of chip connection pads 20.

The plurality of chip connection terminals 220 may each include the pillar layer 222 and the solder layer 224 formed on the pillar layer 222 and contacting the chip connection pad 20.

The semiconductor package 2 may further include the molding member 300 formed on the PCB 100 and surrounding at least a part of the semiconductor chip 200. Also, the semiconductor package 2 may further include the under-fill layer 310 filling a space between the semiconductor chip 200 and the PCB 100.

Since the under-fill layer 310 may be supplied and formed between the PCB 100 and the semiconductor chip 200 along a space on the top surface of the base substrate 10 where the first solder resist layer 32 is not formed, a void may be prevented from being generated inside the semiconductor package 2, and thus reliability of the semiconductor package 2 may be increased.

Figure 17:
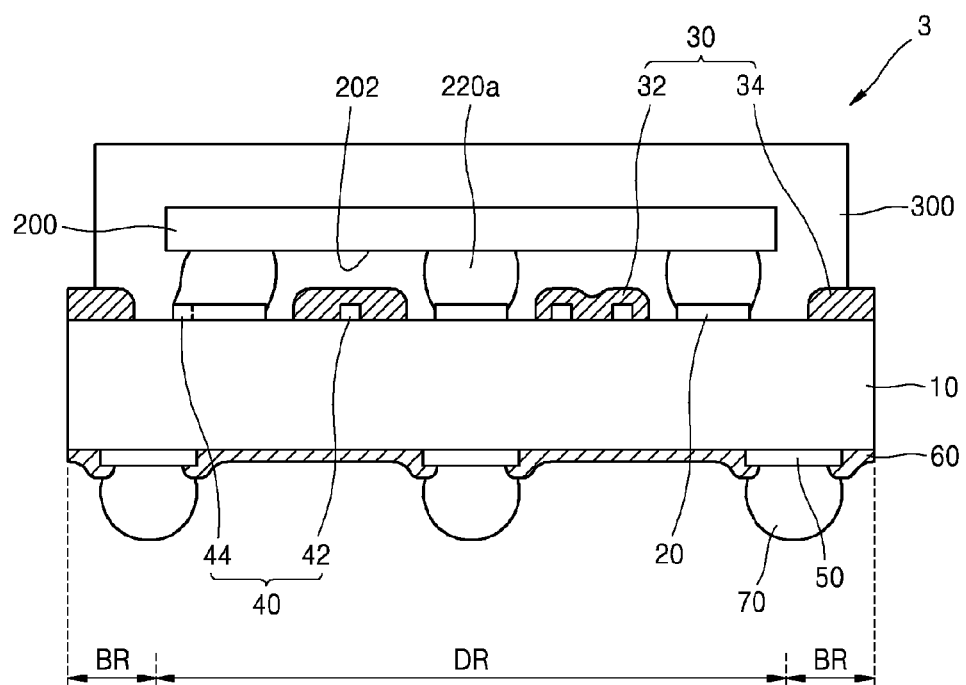
FIG. 17 is a cross-sectional view of main components of a semiconductor package according to another exemplary embodiment.

FIG. 17 is a cross-sectional view of main components of the semiconductor package 3 according to another exemplary embodiment.

Referring to FIG. 17, the semiconductor package 3 includes the PCB 100 and the semiconductor chip 200 attached on the PCB 100.

The PCB 100 includes the base substrate 10 that has the electronic device mounting region DR and the peripheral region BR on the top surface, and the plurality of chip connection pads 20. The plurality of chip connection pads 20 may be disposed in the electronic device mounting region DR of the top surface of the base substrate 10. The external connection pad 50 may be disposed on the bottom surface of the base substrate 10.

The conductive pattern group 40 may be formed on the top surface of the base substrate 10. The conductive pattern group 40 may include the extended conductive pattern 42 and the connected conductive pattern 44. The extended conductive pattern 42 may extend between the two adjacent chip connection pads 20 while being spaced apart from each of the two adjacent chip connection pads 20. The connected conductive pattern 44 may be connected to the chip connection pad 20.

The solder resist layer 30 may be formed on the top surface of the base substrate 10. The solder resist layer 30 may cover a part of the extended conductive pattern 42, and may be spaced apart from the plurality of chip connection pads 20. A part of the top surface of the base substrate 10 may be exposed by the solder resist layer 30. A part of the top surface of the base substrate 10, which contacts the plurality of chip connection pads 20, may be exposed by the solder resist layer 30.

The solder resist layer 30 may include the first solder resist layer 32 and the second solder resist layer 34. The first and second solder resist layers 32 and 34 may be spaced apart from each other. The first solder resist layer 32 may cover a part of the electronic device mounting region DR of the top surface of the base substrate 10. The second solder resist layer 34 may cover at least a part of the peripheral region BR that is a region obtained by excluding the electronic device mounting region DR from the top surface of the base substrate 10.

The bottom surface solder resist layer 60 may be formed on the bottom surface of the base substrate 10. The bottom surface solder resist layer 60 may expose a part of the external connection pad 50.

The semiconductor chip 200 includes a semiconductor device formed on the semiconductor substrate. The semiconductor chip 200 may be attached on the PCB 100 such that the active surface 202 where the semiconductor device is formed faces the PCB 100, e.g., the top surface of the base substrate 10.

The plurality of chip connection terminals 220a attached to the active surface 202 may be formed on the semiconductor chip 200. The plurality of chip connection terminals 220a may be disposed to correspond to the plurality of chip connection pads 20. The plurality of chip connection terminals 220a may each be a solder ball.

In the semiconductor package 1 of FIG. 15, the chip connection terminal 220 includes the pillar layer 222 and the solder layer 224 formed on the pillar layer 222, whereas in the semiconductor package 2 of FIG. 17, the chip connection terminal 220a is a solder ball and is attached to the semiconductor chip 200. Accordingly, the chip connection terminal 220a that is a solder ball reflows, and thus more solder materials contact the chip connection pad 20. Consequently, the semiconductor chip 200 and the PCB 100 may be stably electrically connected to each other, and the chip connection terminal 220a and the extended conductive pattern 42 may be prevented from being electrically connected to generate a short.

Figure 18:
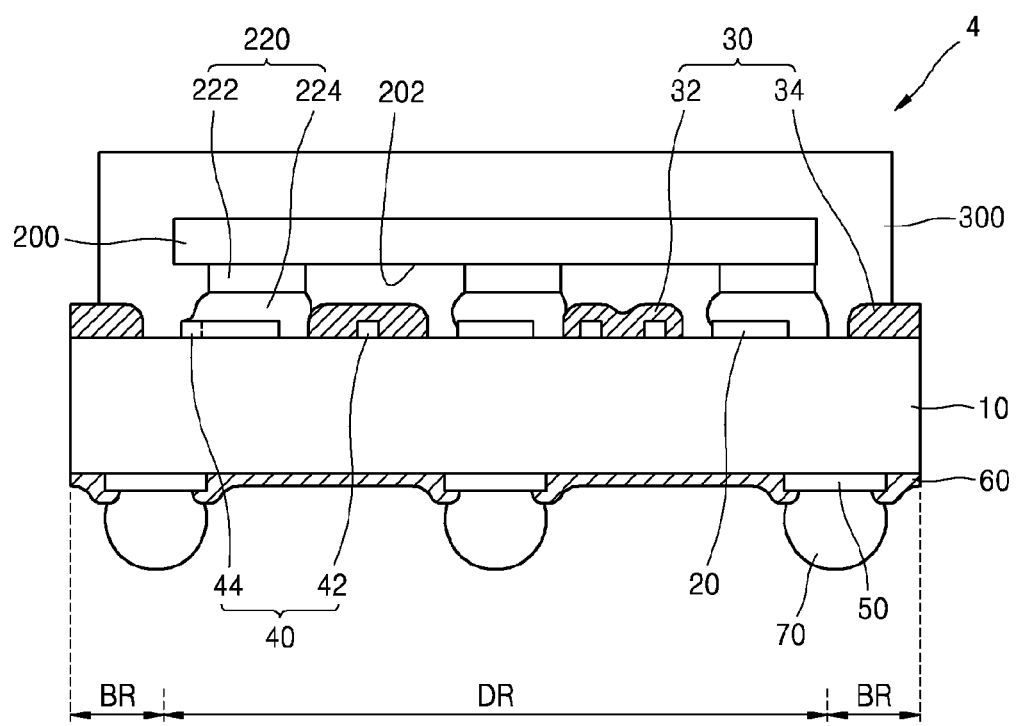
FIG. 18 is a cross-sectional view of main components of a semiconductor package according to another exemplary embodiment.

FIG. 18 is a cross-sectional view of main components of the semiconductor package 4 according to another exemplary embodiment.

Referring to FIG. 18, the semiconductor package 4 includes the PCB 100 and the semiconductor chip 200 attached on the PCB 100.

The PCB 100 includes the base substrate 10 that has the electronic device mounting region DR and the peripheral region BR on the top surface, and the plurality of chip connection pads 20. The plurality of chip connection pads 20 may be disposed in the electronic device mounting region DR of the top surface of the base substrate 10. The external connection pad 50 may be disposed on the bottom surface of the base substrate 10.

The conductive pattern group 40 may be formed on the top surface of the base substrate 10. The conductive pattern group 40 may include the extended conductive pattern 42 and the connected conductive pattern 44. The extended conductive pattern 42 may extend between the two adjacent chip connection pads 20 while being spaced apart from each of the two adjacent chip connection pads 20. The connected conductive pattern 44 may be connected to the chip connection pad 20.

The solder resist layer 30 may be formed on the top surface of the base substrate 10. The solder resist layer 30 may cover a part of the extended conductive pattern 42, and may be spaced apart from the plurality of chip connection pads 20. A part of the top surface of the base substrate 10 may be exposed by the solder resist layer 30. A part of the top surface of the base substrate 10, which contacts the plurality of chip connection pads 20, may be exposed by the solder resist layer 30.

The solder resist layer 30 may include the first solder resist layer 32 and the second solder resist layer 34. The first and second solder resist layers 32 and 34 may be spaced apart from each other. The first solder resist layer 32 may cover a part of the electronic device mounting region DR of the top surface of the base substrate 10. The second solder resist layer 34 may cover at least a part of the peripheral region BR that is a region obtained by excluding the electronic device mounting region DR from the top surface of the base substrate 10.

The bottom surface solder resist layer 60 may be formed on the bottom surface of the base substrate 10. The bottom surface solder resist layer 60 may expose a part of the external connection pad 50.

The semiconductor chip 200 includes a semiconductor device formed on the semiconductor substrate. The semiconductor chip 200 may be attached on the PCB 100 such that the active surface 202 where the semiconductor device is formed faces the PCB 100, e.g., the top surface of the base substrate 10.

The plurality of chip connection terminals 220 attached to the active surface 202 may be formed on the semiconductor chip 200. The plurality of chip connection terminals 220 may be disposed to correspond to the plurality of chip connection pads 20.

The plurality of chip connection terminals 220 may each include the pillar layer 222 and the solder layer 224 formed on the pillar layer 222 and contacting the chip connection pad 20. The solder layer 224 may reflow and contact a part of the solder resist layer 30, e.g., the first solder resist layer 32, which covers a part of the extended conductive pattern 42 adjacent to the chip connection pad 20 contacting the solder layer 224. Also, the solder layer 224 may contact a part of the top surface of the base substrate 10, which is adjacent to the chip connection pad 20 contacting the solder layer 224 and exposed by the solder resist layer 30, e.g., the first solder resist layer 32.

Since the solder layer 224 and the extended conductive pattern 42 may be spaced apart from each other and the first solder resist layer 32 may be disposed between the solder layer 224 and the extended conductive pattern 42, the semiconductor package 4 may prevent the solder layer 224 from being electrically connected to the extended conductive pattern 42 adjacent to the chip connection pad 20 to prevent a short. In other words, even when the semiconductor package 4 sufficiently reflows the solder layer 224, the solder layer 224 is not electrically connected to the extended conductive pattern 42 adjacent to the chip connection pad 20, and thus a short is prevented. Accordingly, the solder layer 224 and the chip connection pad 20 may be stably electrically connected to each other.

Figure 19:
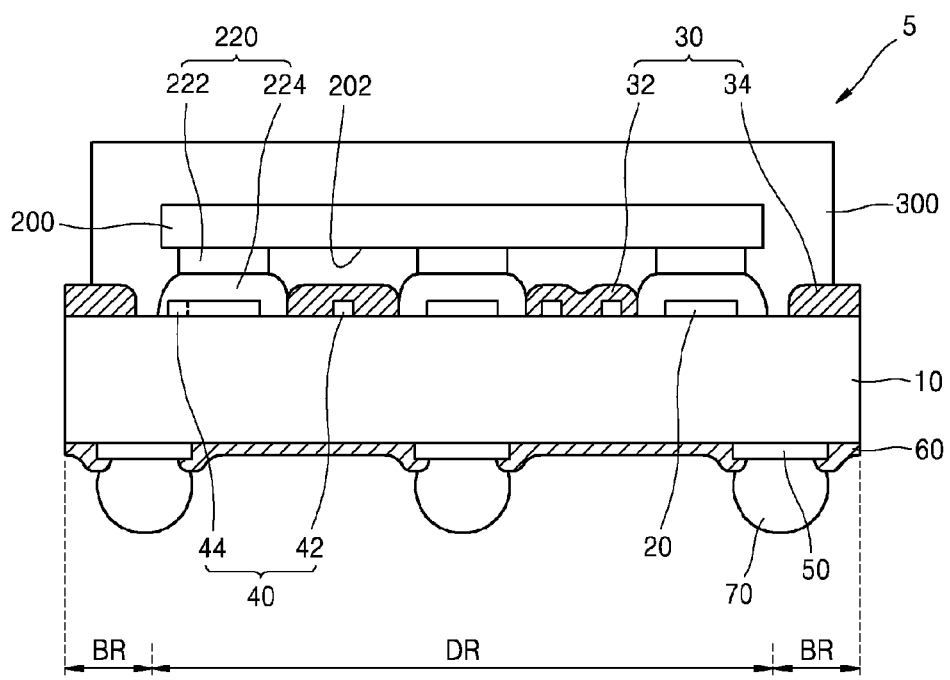
FIG. 19 is a cross-sectional view of main components of a semiconductor package according to another exemplary embodiment.

FIG. 19 is a cross-sectional view of main components of the semiconductor package 5 according to another exemplary embodiment.

Referring to FIG. 19, the semiconductor package 5 includes the PCB 100 and the semiconductor chip 200 attached on the PCB 100.

The PCB 100 includes the base substrate 10 that has the electronic device mounting region DR and the peripheral region BR on the top surface, and the plurality of chip connection pads 20. The plurality of chip connection pads 20 may be disposed in the electronic device mounting region DR of the top surface of the base substrate 10. The external connection pad 50 may be disposed on the bottom surface of the base substrate 10.

The conductive pattern group 40 may be formed on the top surface of the base substrate 10. The conductive pattern group 40 may include the extended conductive pattern 42 and the connected conductive pattern 44. The extended conductive pattern 42 may extend between the two adjacent chip connection pads 20 while being spaced apart from each of the two adjacent chip connection pads 20. The connected conductive pattern 44 may be connected to the chip connection pad 20.

The solder resist layer 30 may be formed on the top surface of the base substrate 10. The solder resist layer 30 may cover a part of the extended conductive pattern 42, and may be spaced apart from the plurality of chip connection pads 20. A part of the top surface of the base substrate 10 may be exposed by the solder resist layer 30. A part of the top surface of the base substrate 10, which contacts the plurality of chip connection pads 20, may be exposed by the solder resist layer 30.

The solder resist layer 30 may include the first solder resist layer 32 and the second solder resist layer 34. The first and second solder resist layers 32 and 34 may be spaced apart from each other. The first solder resist layer 32 may cover a part of the electronic device mounting region DR of the top surface of the base substrate 10. The second solder resist layer 34 may cover at least a part of the peripheral region BR that is a region obtained by excluding the electronic device mounting region DR from the top surface of the base substrate 10.

The bottom surface solder resist layer 60 may be formed on the bottom surface of the base substrate 10. The bottom surface solder resist layer 60 may expose a part of the external connection pad 50.

The semiconductor chip 200 includes a semiconductor device formed on the semiconductor substrate. The semiconductor chip 200 may be attached on the PCB 100 such that the active surface 202 where the semiconductor device is formed faces the PCB 100, e.g., the top surface of the base substrate 10.

The plurality of chip connection terminals 220 attached to the active surface 202 may be formed on the semiconductor chip 200. The plurality of chip connection terminals 220 may be disposed to correspond to the plurality of chip connection pads 20.

The plurality of chip connection terminals 220 may each include the pillar layer 222 and the solder layer 224 formed on the pillar layer 222 and contacting the chip connection pad 20. The solder layer 224 may reflow and contact each of parts of the solder resist layer 30, e.g., the first solder resist layer 32, which cover a part of the extended conductive pattern 42 adjacent to two sides of the chip connection pad 20 contacting the solder layer 224. Also, the solder layer 224 may contact a part of the top surface of the base substrate 10, which is adjacent to the chip connection pad 20 contacting the solder layer 224 and exposed by the solder resist layer 30, e.g., the first solder resist layer 32.

Since the solder layer 224 and the extended conductive pattern 42 may be spaced apart from each other and the first solder resist layer 32 may be disposed between the solder layer 224 and the extended conductive pattern 42, the semiconductor package 5 may prevent the solder layer 224 from being electrically connected to the extended conductive pattern 42 adjacent to the chip connection pad 20 to prevent a short. In other words, even when the semiconductor package 5 sufficiently reflows the solder layer 224, the solder layer 224 is not electrically connected to the extended conductive pattern 42 adjacent to the chip connection pad 20, and thus a short is prevented. Accordingly, the solder layer 224 and the chip connection pad 20 may be stably electrically connected to each other.

Figure 20:
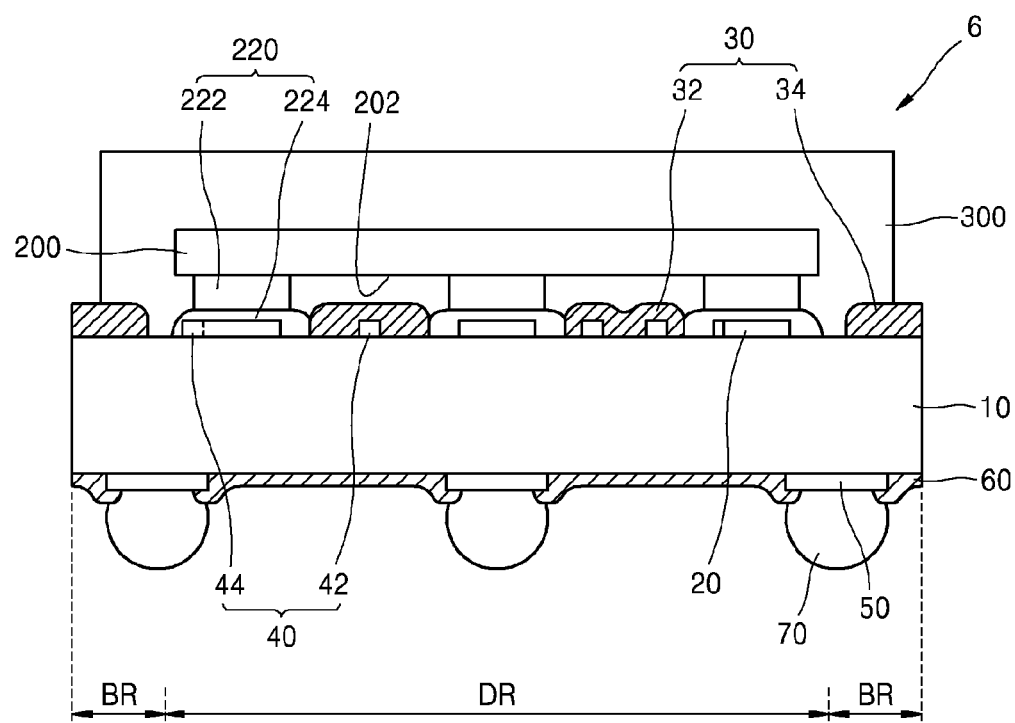
FIG. 20 is a cross-sectional view of main components of a semiconductor package according to another exemplary embodiment.

FIG. 20 is a cross-sectional view of main components of the semiconductor package 6 according to another exemplary embodiment.

Referring to FIG. 20, the semiconductor package 6 includes the PCB 100 and the semiconductor chip 200 attached on the PCB 100.

The PCB 100 includes the base substrate 10 that has the electronic device mounting region DR and the peripheral region BR on the top surface, and the plurality of chip connection pads 20. The plurality of chip connection pads 20 may be disposed in the electronic device mounting region DR of the top surface of the base substrate 10. The external connection pad 50 may be disposed on the bottom surface of the base substrate 10.

The conductive pattern group 40 may be formed on the top surface of the base substrate 10. The conductive pattern group 40 may include the extended conductive pattern 42 and the connected conductive pattern 44. The extended conductive pattern 42 may extend between the two adjacent chip connection pads 20 while being spaced apart from each of the two adjacent chip connection pads 20. The connected conductive pattern 44 may be connected to the chip connection pad 20.

The solder resist layer 30 may be formed on the top surface of the base substrate 10. The solder resist layer 30 may cover a part of the extended conductive pattern 42, and may be spaced apart from the plurality of chip connection pads 20. A part of the top surface of the base substrate 10 may be exposed by the solder resist layer 30. A part of the top surface of the base substrate 10, which contacts the plurality of chip connection pads 20, may be exposed by the solder resist layer 30.

The solder resist layer 30 may include the first solder resist layer 32 and the second solder resist layer 34. The first and second solder resist layers 32 and 34 may be spaced apart from each other. The first solder resist layer 32 may cover a part of the electronic device mounting region DR of the top surface of the base substrate 10. The second solder resist layer 34 may cover at least a part of the peripheral region BR that is a region obtained by excluding the electronic device mounting region DR from the top surface of the base substrate 10.

The bottom surface solder resist layer 60 may be formed on the bottom surface of the base substrate 10. The bottom surface solder resist layer 60 may expose a part of the external connection pad 50.

The semiconductor chip 200 includes a semiconductor device formed on the semiconductor substrate. The semiconductor chip 200 may be attached on the PCB 100 such that the active surface 202 where the semiconductor device is formed faces the PCB 100, e.g., the top surface of the base substrate 10.

The plurality of chip connection terminals 220 attached to the active surface 202 may be formed on the semiconductor chip 200. The plurality of chip connection terminals 220 may be disposed to correspond to the plurality of chip connection pads 20.

The plurality of chip connection terminals 220 may each include the pillar layer 222 and the solder layer 224 formed on the pillar layer 222 and contacting the chip connection pad 20. The solder layer 224 may reflow and contact each of parts of the solder resist layer 30, e.g., the first solder resist layer 32, which cover a part of the extended conductive pattern 42 adjacent to two sides of the chip connection pad 20 contacting the solder layer 224. Also, the solder layer 224 may contact a part of the top surface of the base substrate 10, which is adjacent to the chip connection pad 20 contacting the solder layer 224 and exposed by the solder resist layer 30, e.g., the first solder resist layer 32.

The pillar layer 222 may further extend from the top surface of the solder resist layer 30, e.g., the first solder resist layer 32, towards the base substrate 10. In other words, a top surface of the pillar layer 222, which faces the base substrate 10, may be closer to the base substrate 10 than a top surface of the first solder resist layer 32.

Since the solder layer 224 and the extended conductive pattern 42 may be spaced apart from each other and the first solder resist layer 32 may be disposed between the solder layer 224 and the extended conductive pattern 42, the semiconductor package 6 may prevent the solder layer 224 from being electrically connected to the extended conductive pattern 42 adjacent to the chip connection pad 20 to prevent a short. In other words, even when the semiconductor package 6 sufficiently reflows the solder layer 224, the solder layer 224 is not electrically connected to the extended conductive pattern 42 adjacent to the chip connection pad 20, and thus a short is prevented. Accordingly, the solder layer 224 and the chip connection pad 20 may be stably electrically connected to each other.

Also, the volume of the solder layer 224 is formed to be relatively small while sufficiently reflowing the solder layer 224 such that the pillar layer 222 further extends from the top surface of the first solder resist layer 32 towards the base substrate 10. At this time, the solder layer 224 and the chip connection pad 20 are stably electrically connected to each other and an amount of the reflowed solder layer 224 flowing outside the limited space between the two adjacent chip connection pads 20 is decreased. Accordingly, the solder layer 224 may be prevented from being electrically connected to another region of the conductive pattern group 40.

Figure 21:
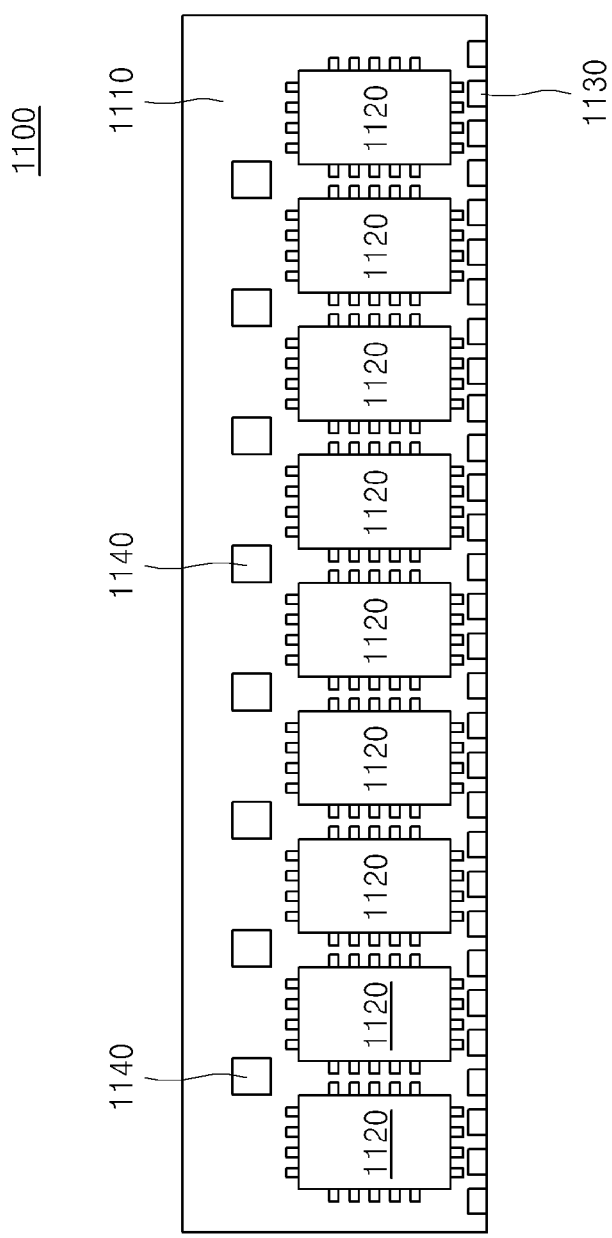
FIG. 21 is a plan view of a memory module including a semiconductor package, according to an exemplary embodiment.

FIG. 21 is a plan view of a memory module 1100 including a semiconductor package 1120, according to an exemplary embodiment.

Referring to FIG. 21, the memory module 1100 includes a module substrate 1110 and a plurality of the semiconductor packages 1120 attached to the module substrate 1110.

The semiconductor package 1120 may be a semiconductor package according to an exemplary embodiment. For example, the semiconductor package 1120 may be any one of the semiconductor packages 1 through 6 of FIGS. 15 through 20.

A connector 1130 insertable into a socket of a motherboard may be disposed at one side of the module substrate 1110. A ceramic decoupling capacitor 1140 is disposed on the module substrate 1110. The memory module 1100 according to an exemplary embodiment is not limited to that of FIG. 21, and may be manufactured to have many different types of structures.

The semiconductor package 1120 included in the memory module 1100 may include a fine-pitch connection terminal, and thus may be miniaturized and may correspond to a wide input/output (I/O). Thus, the memory module 1100 may have high capacity and high performance.

Figure 22:
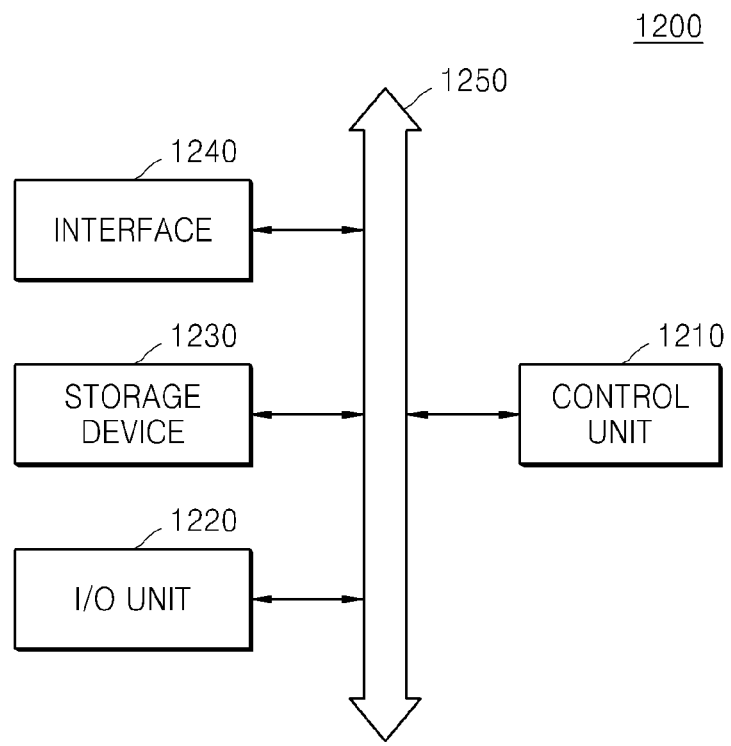
FIG. 22 is a block diagram of a system including a semiconductor package, according to an exemplary embodiment.

FIG. 22 is a block diagram of a system 1200 including a semiconductor package, according to an exemplary embodiment.

Referring to FIG. 22, the system 1200 includes a control unit 1210 (e.g., controller), an I/O unit 1220, a storage device 1230, and an interface 1240. The system 1200 may be a mobile system or a system that transmits or receives information. According to one or more exemplary embodiments, the mobile system may be a personal digital assistant (PDA), a portable computer, a web tablet, a wireless phone, a mobile phone, a digital music player, or a memory card. The control unit 1210 controls an execution program in the system 1200, and may include a microprocessor, a digital signal processor, a microcontroller, or a device similar thereto. For example, the control unit 1210 may include any one of the semiconductor packages 1 through 6 of FIGS. 15 through 20.

The I/O unit 1220 may be used to input or output data to and from the system 1200. The system 1200 may be connected to an external device, such as a personal computer (PC) or a network, by using the I/O unit 1220, and may exchange data with the external device. The I/O unit 1220 may be a keypad, a keyboard, or a display.

The storage device 1230 may store a code and/or other types of data for operating the control unit 1210, or may store data processed by the control unit 1210. The storage device 1230 includes a semiconductor package according to an exemplary embodiment. For example, the storage device 1230 may include any one of the semiconductor packages 1 through 6 of FIGS. 15 through 20.

The interface 1240 may be a data transmission path between the system 1200 and an external device. The control unit 1210, the I/O unit 1220, the storage device 1230, and the interface 1240 may communicate with each other via a bus 1250. The system 1200 may be used in a mobile phone, an MP3 player, a navigation device, a portable multimedia player (PMP), a solid state disk (SSD), or a household appliance.

The control unit 1210 or the storage device 1230 included in the system 1200 may include a fine-pitch connection terminal, and thus may be miniaturized and may correspond to a wide I/O. Thus, the system 1200 may have high capacity and high performance.

Figure 23:
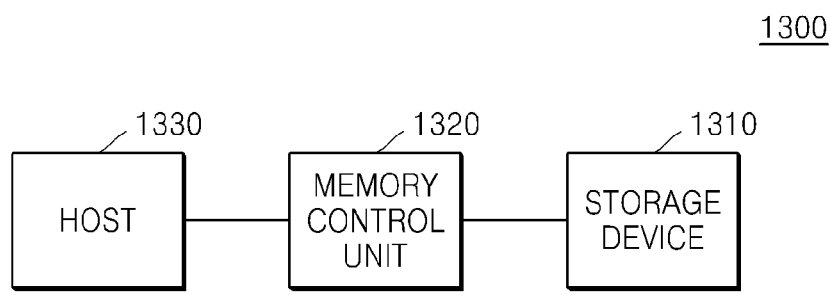
FIG. 23 is a block diagram of a memory card including a semiconductor package, according to an exemplary embodiment.

FIG. 23 is a block diagram of a memory card 1300 including a semiconductor package, according to an exemplary embodiment.

Referring to FIG. 23, the memory card 1300 includes a storage device 1310, a memory control unit 1320 (e.g., memory controller), and communicates with a host 1330.

The storage device 1310 may store data. According to one or more exemplary embodiments, the storage device 1310 has a nonvolatile characteristic, wherein stored data may be maintained even if power is stopped from being supplied to the storage device 1310. The storage device 1310 includes a semiconductor package according to an exemplary embodiment. For example, the storage device 1310 may include any one of the semiconductor packages 1 through 6 of FIGS. 15 through 20.

The memory control unit 1320 may read data stored in the storage device 1310 or store data in the storage device 1310 in response to a read/write request of the host 1330.

The storage device 1310 may include a fine-pitch connection terminal, and thus may be miniaturized and may correspond to a wide I/O. Thus, the memory card 1300 may have high capacity and high performance.

Figure 24:
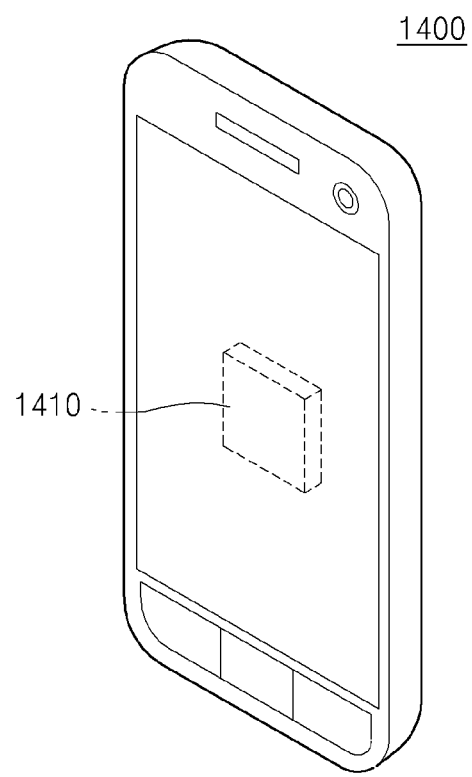
FIG. 24 is a schematic perspective view of an electronic apparatus to which a semiconductor package is applied, according to an exemplary embodiment.

FIG. 24 is a schematic perspective view of an electronic apparatus to which a semiconductor package is applied, according to an exemplary embodiment.

In FIG. 24, the system 1200 of FIG. 22 is applied to a mobile phone 1400. The mobile phone 1400 may include a system-on-chip (SOC) 1410. The SOC 1410 may include any one of the semiconductor packages 1 through 6 of FIGS. 15 through 20.

The mobile phone 1400 may include a fine-pitch connection terminal, and thus may include the SOC 1410 that may be miniaturized and may correspond to a wide I/O. Thus, the mobile phone 1400 may have high capacity and high performance.

According to a PCB and a semiconductor package using the PCB according to one or more exemplary embodiments, since an under-fill layer or an under-fill material, such as an MUF, which fills a space between the PCB and a semiconductor chip, may be provided along a space on a top surface of a base substrate where a solder resist layer is not formed, a void may be prevented from being generated in the semiconductor package, and thus reliability of the semiconductor package may be increased.

Also, the PCB according to one or more exemplary embodiments prevents a short and enables a stable electric connection in response to a semiconductor chip having a fine-pitch connection terminal, and thus the semiconductor package having reliability may be provided.

Accordingly, the PCB and the semiconductor package using the PCB according to one or more exemplary embodiments may be miniaturized and may correspond to a wide I/O. Thus, a memory module, a system, and a memory card having high capacity and high performance may be provided, and a mobile phone having a small size and which achieves high performance may be provided.

While the inventive concept has been particularly shown and described with reference to exemplary embodiments thereof, it will be understood that various changes in form and details may be made therein without departing from the spirit and scope of the following claims.

What is claimed is:

1. A printed circuit board (PCB) comprising:
   a base substrate comprising a top surface comprising an electronic device mounting region;
   chip connection pads that are provided on the electronic device mounting region;
   a conductive pattern group that is provided on the top surface of the base substrate and comprises an extended conductive pattern extending between two adjacent chip connection pads from among the chip connection pads, the extended conductive pattern being spaced apart from each of the two adjacent chip connection pads; and a solder resist layer that covers a part of the extended conductive pattern, is spaced apart from the chip connection pads, and comprises a plurality of pieces that have a same shape and are evenly distributed across the entire electronic device mounting region in a pattern.

2. The PCB of claim 1, wherein the solder resist layer comprises:

a first solder resist layer that is the plurality of pieces and covers a part of the electronic device mounting region on the top surface of the base substrate; and a second solder resist layer that covers at least a part of a region excluding the electronic device mounting region on the top surface of the base substrate.

3. The PCB of claim 2, wherein the second solder resist layer is spaced apart from the first solder resist layer.

4. The PCB of claim 2, wherein the conductive pattern group protrudes from the top surface of the base substrate, and the first solder resist layer covers both a part of a side surface and a part of a top surface of the protruding extended conductive pattern.

5. The PCB of claim 2, wherein a part of the conductive pattern group is embedded in the top surface of the base substrate, and the first solder resist layer covers a part of the extended conductive pattern provided in a space between the two adjacent chip connection pads.

6. The PCB of claim 2, wherein the first solder resist layer is provided plurally as the plurality of pieces and the first solder resist layers have island shapes which are spaced apart from each other.

7. The PCB of claim 6, wherein the second solder resist layer is integrally formed on the top surface of the base substrate.

8. The PCB of claim 6, wherein the first solder resist layers each have an L-shape.

9. The PCB of claim 6, wherein the chip connection pads are arranged in a matrix array structure.

10. The PCB of claim 6, wherein the chip connection pads are arranged in a hexagonal array structure.

11. The PCB of claim 6, wherein the first solder resist layers form a hexagonal array structure and are provided between the chip connection pads.

12. The PCB of claim 2, wherein the first solder resist layer further externally extends from a space between the two adjacent chip connection pads.

13. The PCB of claim 2, wherein the first solder resist layer extends in a diagonal direction between the chip connection pads.

14. The PCB of claim 2, wherein the first solder resist layer extends in a zigzag form between the chip connection pads.

15. The PCB of claim 2, wherein the first solder resist layer extends in a square wave form between the chip connection pads.

16. The PCB of claim 1, wherein the chip connection pads and the conductive pattern group have top surfaces provided at a same height with respect to the base substrate.

17. The PCB of claim 1, wherein a part of the top surface of the base substrate contacting the chip connection pads is exposed by the solder resist layer.

18. A semiconductor package comprising:

a printed circuit board (PCB) comprising:

a base substrate comprising a top surface comprising an electronic device mounting region, chip connection pads that are provided on the electronic device mounting region, a conductive pattern group that is provided on the top surface of the base substrate and comprises an extended conductive pattern extending between two adjacent chip connection pads among the chip connection pads, the extended conductive pattern being spaced apart from each of the two adjacent chip connection pads, and a solder resist layer that covers a part of the extended conductive pattern, is spaced apart from the plurality of chip connection pads, and comprises a plurality of pieces that have a same shape and are evenly distributed across the entire electronic device mounting region in a pattern;

a semiconductor chip comprising a semiconductor substrate comprising an active surface, and chip connection terminals that are adhered to the active surface of the semiconductor substrate and correspond to the chip connection pads, the semiconductor chip adhering to the electronic device mounting region of the PCB such that the active surface faces the top surface of the base substrate; and a molding member formed on the PCB and surrounding part of the semiconductor chip.

19. The semiconductor package of claim 18, wherein the chip connection terminals each respectively comprise a pillar layer and a solder layer that is provided on the pillar layer and contacts one of the chip connection pads.

20. The semiconductor package of claim 19, wherein the solder layer contacts a part of the solder resist layer that covers a part of the extended conductive pattern provided adjacent to the chip connection pads contacting the solder layer.

21. The semiconductor package of claim 20, wherein the extended conductive pattern is disposed on both sides of a chip connection pad from among the chip connection pads, and the solder layer contacting the chip connection pad contacts a part of the solder resist layer covering a part of the extended conductive pattern disposed on both sides of the chip connection pad.

22. The semiconductor package of claim 20, wherein the extended conductive pattern and the solder layer are spaced apart from each other and the solder resist layer is provided between the extended conductive pattern and the solder layer.

23. The semiconductor package of claim 19, wherein the pillar layer extends from a top surface of the solder resist layer towards the base substrate.

24. The semiconductor package of claim 19, wherein the molding member covers a part of the top surface of the base substrate, which is exposed by the solder resist layer and the chip connection pads.

25. The semiconductor package of claim 19, wherein the solder layer is adjacent to one of the chip connection pads contacting the solder layer and contacts a part of the top surface of the base substrate, which is exposed by the solder resist layer.

26. The semiconductor package of claim 18, wherein the chip connection terminals are each configured as a solder ball.

27. The semiconductor package of claim 18, wherein the molding member covers all of the electronic device mounting region of the base substrate.

28. A printed circuit board (PCB) comprising:
a base substrate comprising a top surface comprising an electronic device mounting region;
chip connection pads that are provided on the electronic device mounting region;
a conductive pattern group that is provided on the top surface of the base substrate, and comprises a connected conductive pattern connected to the chip connection pads, and an extended conductive pattern extending between two adjacent chip connection pads from among the chip connection pads, the extended conductive pattern being spaced apart from the two adjacent chip connection pads; and
a solder resist layer that covers a part of the extended conductive pattern on the top surface of the base substrate, and comprises a first solder resist layer spaced apart from the chip connection pads and a second solder resist layer covering a part of a region excluding the electronic device mounting region on the top surface of the base substrate, the first solder resist layer comprising a plurality of pieces that have a same shape and are evenly distributed across the entire electronic device mounting region in a pattern.

29. The PCB of claim 28, wherein a part of the connected conductive pattern, which contacts the chip connection pads, is exposed by the first solder resist layer.

30. The PCB of claim 28, wherein a part of a top surface of the first solder resist layer, which covers the extended conductive pattern, has a height higher than a height of a top surface of the chip connection pads with respect to the base substrate.

31. A semiconductor package, comprising:
a base substrate comprising an electronic device mounting region;
pads provided on a surface of the base substrate in the electronic device mounting region;
a conductive pattern provided on the surface of the base substrate and between two of the pads;
a solder resist layer covering the conductive pattern;
a semiconductor chip connected to the pads; and
a filling material that fills spaces formed between the surface of the base substrate, the solder resist layer, the semiconductor chip, and the pads, wherein
the solder resist layer covers a part of the conductive pattern, is spaced apart from the pads, and comprises a plurality of pieces that have a same shape and are evenly distributed across the entire electronic device mounting region in a pattern.

32. The semiconductor package of claim 31, further comprising a molding member formed to cover the semiconductor chip,
wherein the molding member covers a part of a top surface of the base substrate, which is exposed by the solder resist layer and the pads.

33. The semiconductor package of claim 32, wherein the filling material and the molding member comprise the same material.

* * * * *